United States Patent
Morita

(10) Patent No.: US 7,957,822 B2
(45) Date of Patent: Jun. 7, 2011

(54) COMPONENT MOUNTER CONTROL METHOD AND COMPONENT MOUNTER

(75) Inventor: Keita Morita, Saga (JP)

(73) Assignee: Panasonic Corporation, Osaka (JP)

( * ) Notice: Subject to any disclaimer, the term of this patent is extended or adjusted under 35 U.S.C. 154(b) by 453 days.

(21) Appl. No.: 12/162,686

(22) PCT Filed: Jan. 30, 2007

(86) PCT No.: PCT/JP2007/051863
§ 371 (c)(1),
(2), (4) Date: Jul. 30, 2008

(87) PCT Pub. No.: WO2007/091499
PCT Pub. Date: Aug. 16, 2007

(65) Prior Publication Data
US 2009/0049680 A1 Feb. 26, 2009

(30) Foreign Application Priority Data
Feb. 10, 2006 (JP) .................... 2006-034447

(51) Int. Cl.
*G05B 13/02* (2006.01)
*G06F 19/00* (2006.01)
*B23P 19/00* (2006.01)

(52) U.S. Cl. .............. 700/56; 29/743; 700/32; 700/100; 700/104; 700/121

(58) Field of Classification Search .................... 700/56, 700/100, 104, 32, 121; 29/743
See application file for complete search history.

(56) References Cited

U.S. PATENT DOCUMENTS

| 4,245,297 A | * | 1/1981 | Bertram | 700/56 |
| 5,166,884 A | * | 11/1992 | Maney et al. | 700/113 |
| 5,646,681 A | * | 7/1997 | Okazaki | 348/87 |
| 5,711,065 A | * | 1/1998 | Asai et al. | 29/740 |
| 5,778,525 A | | 7/1998 | Hata et al. | |
| 6,002,650 A | * | 12/1999 | Kuribayashi et al. | 700/117 |
| 6,223,425 B1 | * | 5/2001 | Asai et al. | 29/740 |
| 6,374,484 B1 | * | 4/2002 | Yoshida et al. | 29/740 |
| 6,996,440 B2 | * | 2/2006 | Maenishi et al. | 700/28 |

(Continued)

FOREIGN PATENT DOCUMENTS

JP 9-130084 5/1997

(Continued)

OTHER PUBLICATIONS

International Search Report issued May 29, 2007 in the International (PCT) Application of which the present application is the U.S. National Stage, 3 pages.

*Primary Examiner* — Albert Decady
*Assistant Examiner* — Thomas Stevens
(74) *Attorney, Agent, or Firm* — Wenderoth, Lind & Ponack, L.L.P.

(57) ABSTRACT

A method controls a component mounter which includes a mobile unit for mounting a component onto a circuit board, and judges on which side of the component mounter as user, who issues an instruction to the component mounter, is present. Additionally, the method performs position control by shifting the mobile unit to a position which allows a maintenance task to be performed on the component mounter from the side on which the user is judged to be present.

7 Claims, 13 Drawing Sheets

U.S. PATENT DOCUMENTS

| | | | |
|---|---|---|---|
| 7,142,939 B2* | 11/2006 | Nonaka et al. | 700/121 |
| 7,367,117 B2* | 5/2008 | Yoshii et al. | 29/833 |
| 7,488,283 B2* | 2/2009 | Yasui | 483/1 |
| 7,841,071 B2* | 11/2010 | Jeserer | 29/739 |
| 2003/0225547 A1 | 12/2003 | Paradies | |
| 2004/0153868 A1* | 8/2004 | Nonaka et al. | 714/47 |
| 2006/0052893 A1* | 3/2006 | Yamazaki et al. | 700/100 |
| 2006/0052909 A1* | 3/2006 | Cherouny | 701/1 |
| 2006/0200264 A1 | 9/2006 | Kodama et al. | |
| 2008/0154392 A1* | 6/2008 | Maenishi et al. | 700/32 |
| 2009/0023243 A1* | 1/2009 | Koyanagi | 438/107 |
| 2009/0259333 A1* | 10/2009 | Yano et al. | 700/121 |

FOREIGN PATENT DOCUMENTS

| | | |
|---|---|---|
| JP | 2001-308596 | 11/2001 |
| JP | 2004-193196 | 7/2004 |
| WO | 2005/009101 | 1/2005 |

* cited by examiner

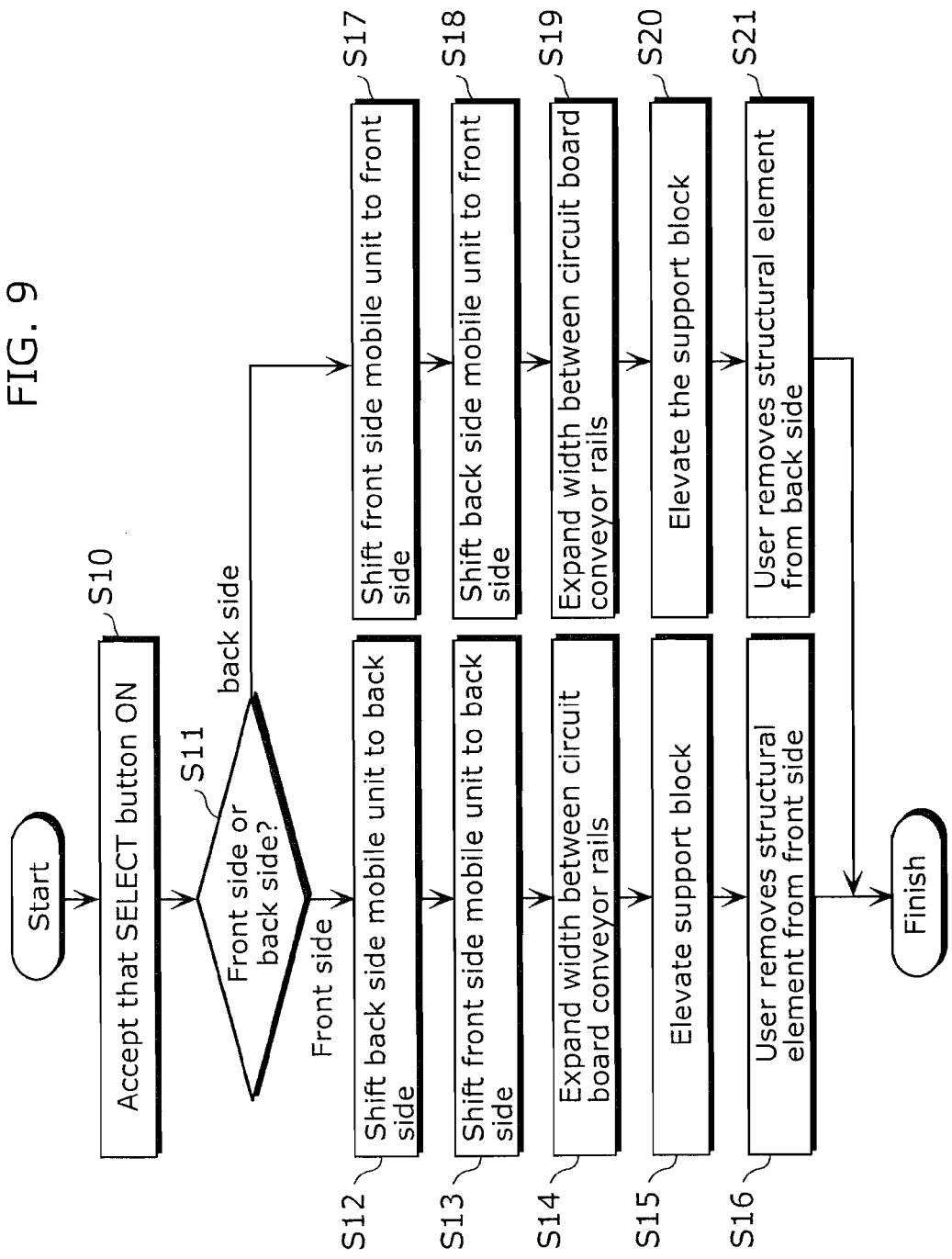

[Instruction issued from front side touch panel]

[Instruction issued from rear side touch panel]

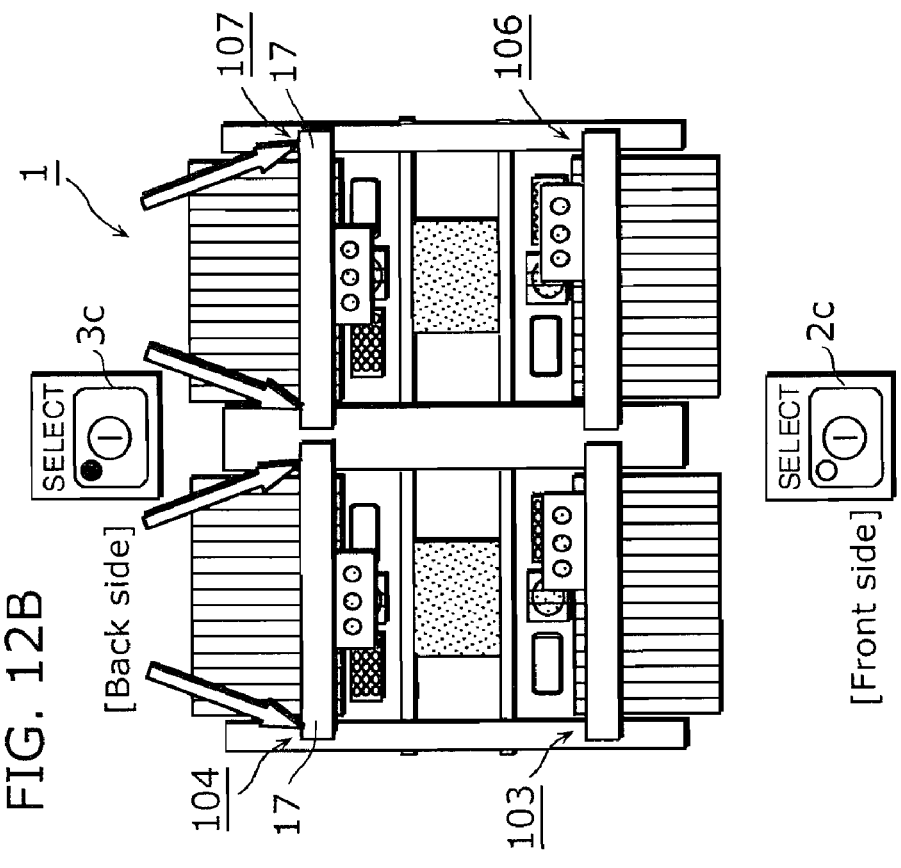
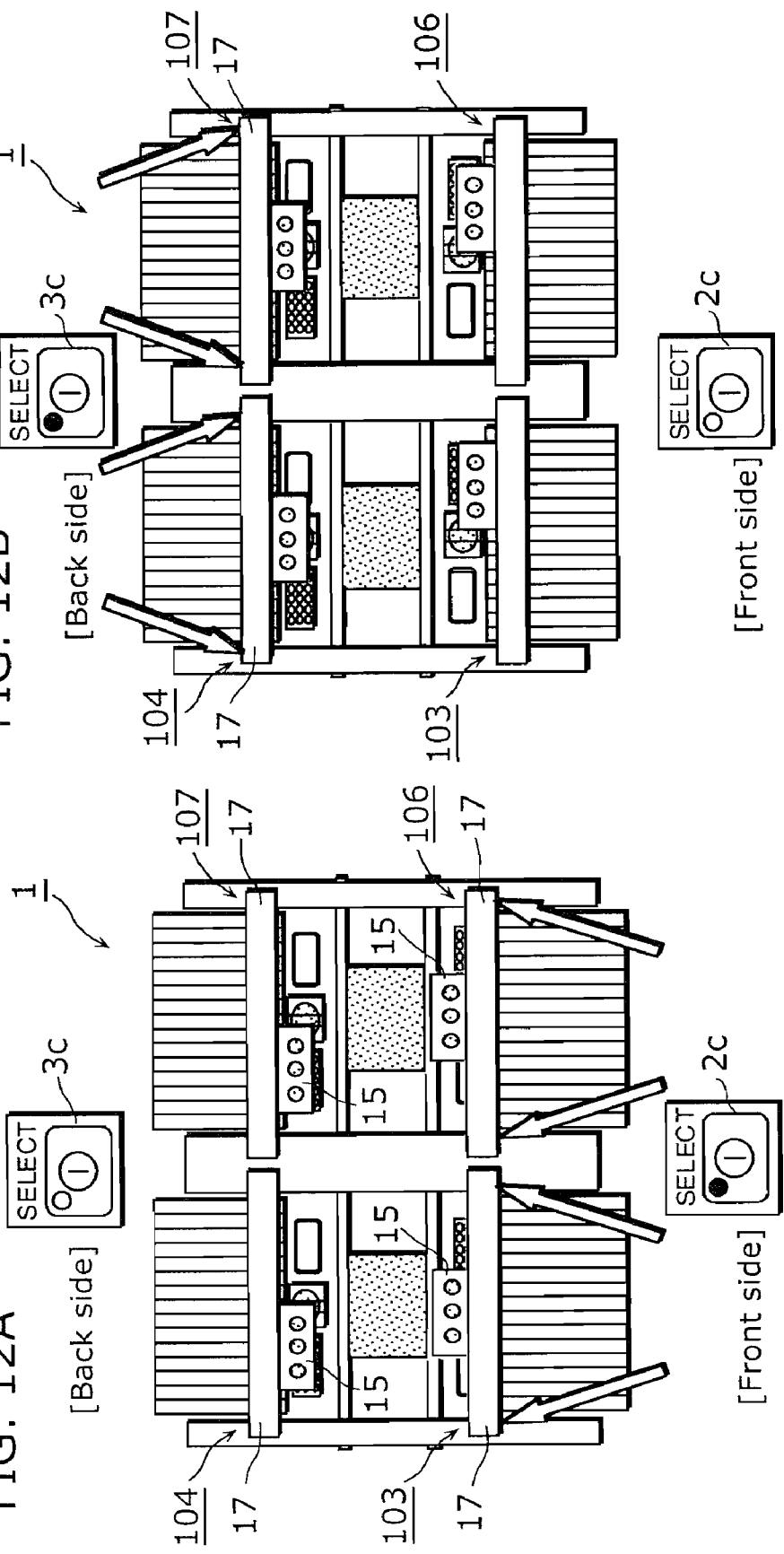

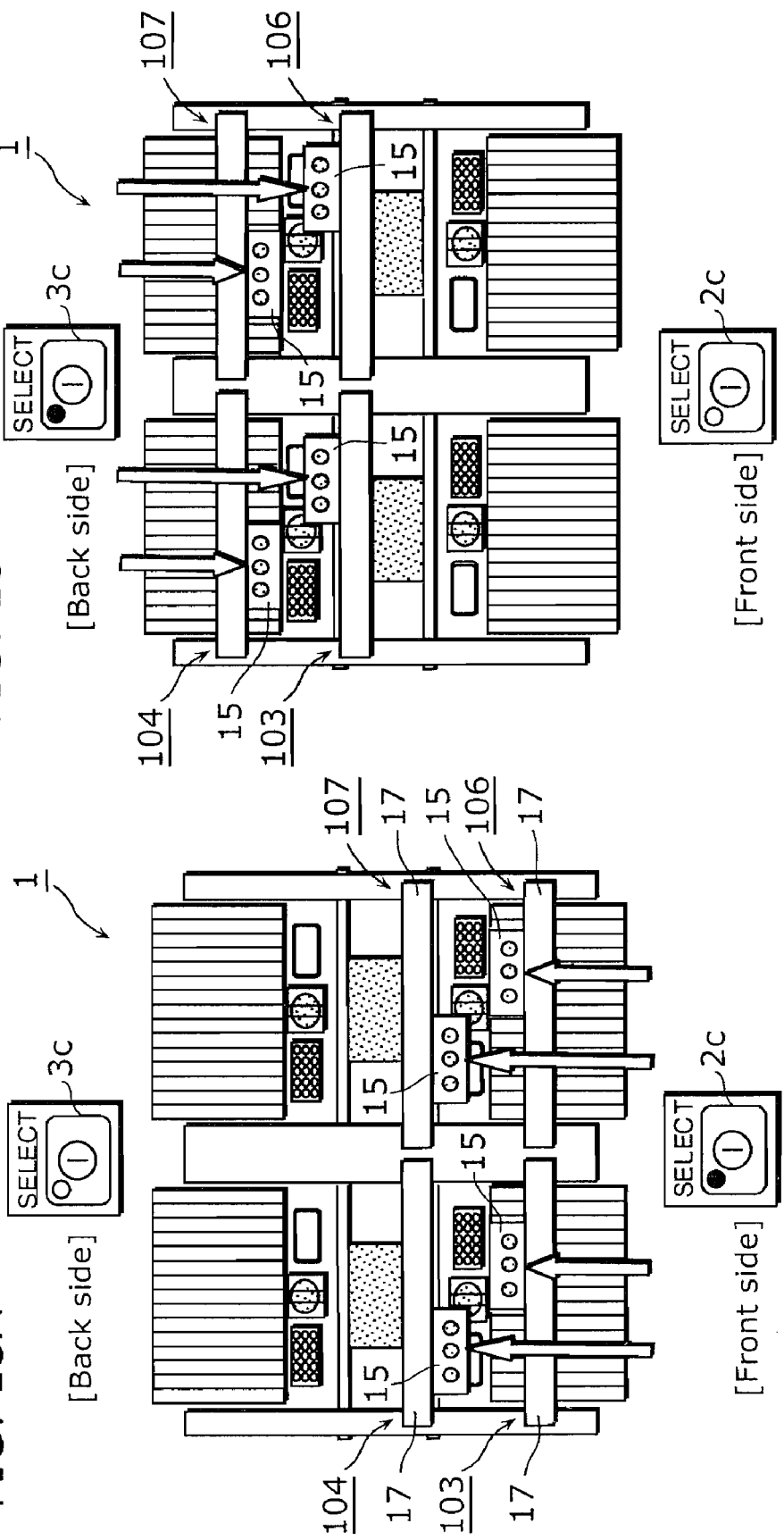

COMPONENT MOUNTER CONTROL METHOD AND COMPONENT MOUNTER

BACK GROUND OF THE INVENTION

1. Technical Field

The present invention relates to a component mounting control method for controlling a component mounter which mounts electronic components and the like onto a circuit board, and a component mounter for executing the method.

2. Background Art

Conventionally, there have been component mounters which function as devices for mounting electronic components (below, simply referred to as 'components') onto a circuit board. Component mounters are equipped with plural component provision units in parallel such as a tape feeder which provides components to the component mounter and a placement head suctions, transfers and mounts components provided by the component provision unit onto the circuit board.

In order to improve the operational efficiency of these component mounters, there are component mounters capable of being operated from either the front or the back of the component mounter (see for example, Patent Reference 1).

In these component mounters, there are operation units on both the front side and back side of the component mounter, by which the user gives commands to the component mounter, and a mobile unit such as a placement head shifts based on the user's command. By shifting the mobile unit, the user can perform maintenance tasks such as cleaning and exchanging the mobile unit or structural elements besides the mobile unit.

Patent Reference 1: Japanese Laid-Open Patent Publication No.

However, in the conventional component mounter above, the direction in which the mobile unit shifts are determined when the maintenance task is performed as above.

For example, it is necessary to exchange and modify the locations of plural support pins which directly support the circuit board and are held on a support block that supports the circuit board in the component mounter, according to the shape of the circuit board on which components will be mounted. This task is referred to as a support pin exchange.

Pin exchanging is performed after removing the support block from the component mounter. At this point, the mobile unit, such as a moving placement head, is brought to one of the sides, and the user can remove the support block from the opposite side.

For conventional component mounters, the placement head is shifted to the back side when a user instructs the mounter to perform a support pin exchange, without regard to whether the instruction is issued from the front side or from the back side. In this case, the support block is removed from the front side of the component mounter. In other words, the user must remove the support block by moving to the front side even when the instruction for exchanging the support pins has been issued from the operation unit on the back side.

Otherwise, for example, when cleaning is performed for the placement head, the placement head is shifted to the front side or the back side of the component mounter for ease of cleaning, and the placement head is cleaned.

For example, in a conventional component mounter that includes two placement heads, A and B, the user must explicitly instruct which placement heads are to be cleaned. In other words, when the user cleans the placement head closest to the side of the component mounter on which the user is present, the user must judge the user's own position and whether the placement head is A or B, and then issue an explicit instruction from the operation unit. In other words, an unnecessary burden is assigned to the user when performing maintenance tasks.

In this way, when the user performs maintenance tasks on a conventional component mounter, useless time and labor costs are generated for the user.

SUMMARY OF THE INVENTION

The present invention takes as an object providing a component mounter control method and a component mounter which allow a user to efficiently implement maintenance tasks for a component mounter in consideration of the problems above.

In order to accomplish the objects above, the component mounter control method in the present invention is a method of controlling a component mounter which includes a mobile unit for mounting a component onto a circuit board, and includes judging on which side of the component mounter a user, who issues an instruction to the component mounter, is present; and shifting the mobile unit to a position which allows a maintenance task to be performed on the component mounter from the side on which the user is judged to be present.

Thus, the user can perform the maintenance task on the component mounter from the side on which the user is present. When the maintenance task is begun, there is also no need to judge which side of the component mounter the user is on, nor to which side the mobile unit should be shifted to and so on. In other words, a component mounter control method can be provided that allows the user to efficiently perform a maintenance task.

Also, the component mounter in the present invention further includes accepting the instruction by the user, and in the judging, when the instruction by the user is accepted in the accepting, the side of the component mounter on which the user is present may be judged. The component mounter control includes plural operation units for the user to issue the instruction to the component mounter; in the accepting, the instruction by the user issued from one of the operation units is accepted, and in the judging, the side of the component mounter on which the user is present may be judged according to which operation unit has issued the instruction by the user, which is accepted in the accepting above.

Thus, the component mounter can judge on which side of the component mounter the user is present according to the instruction from the operation unit by the user. For example, when the user has issued some kind of instruction from the operation unit that is normally used for operating the component mounter, the side of the component mounter on which the user is present can be judged. In other words, typical actions performed by the user can be ascertained and judged. Thus, during the judgment, the user is not burdened unnecessarily.

Also, the plural operation units may be installed respectively to the front side and the back side of the component mounter, and in the judging, when the instruction by the user is issued from the operation unit on the front side in the accepting, the user may be judged to be present on the front side of the component mounter, and when the instruction by the user issued from the operation unit on the back side is accepted in the accepting, the user may be judged to be present on the back side of the component mounter.

Thus, it is possible to execute a component mounter control method in the component mounter, which has an operation unit at the front and the back.

Also, with the component mounter control method in the present invention, the maintenance task is performed on a structural element of the component mounter besides the mobile unit, and in the shifting, the mobile unit may be shifted to a position that allows the maintenance task to be performed by shifting the mobile unit outside of a predetermined area necessary for the maintenance task.

In this way, the mobile unit is shifted outside of the predetermined area necessary for the maintenance work, in other words, by retracting the mobile unit from the predetermined area, the structural element targeted for the maintenance task can be removed from the side on which the user is present, or the user can touch the structural element. For example, maintenance tasks can be performed such as removing the support block and exchanging the support pins, exchanging a component provision unit which provides components, for mounting to the circuit board, to the component mounter, maintaining the optical system for optically confirming information related to the components to be mounted to the circuit board, and exchanging nozzles held by a nozzle station.

Also, in the component mounter control method, the maintenance task is performed on the mobile unit, and in the shifting, the mobile unit may be shifted to a position which allows the maintenance task to be performed by shifting at least one part of the mobile unit into a predetermined area from which the maintenance task can be performed.

In this way, by shifting at least one part of the mobile unit into the predetermined area from which the maintenance task can be performed on the mobile unit, the maintenance task can be performed on at least one part of the mobile unit from the side on which the user is present. For example, maintenance tasks such as greasing the mobile unit, cleaning and exchanging the placement head can be performed.

Also, the component mounter in the present invention is a component mounter which includes a mobile unit for mounting a component onto a circuit board and also includes a judgment unit which judges on which side of the component mounter a user who issues an instruction to the component mounter is present; and a position control unit which shifts the mobile unit to a position which allows a maintenance task to be performed on the component mounter from the side on which the user is judged to be present according to the result of the judgment by the judgment unit.

Thus, the user can perform the maintenance task on the component mounter from the side on which the user is present. Also, when the maintenance task is begun, the user does not have to judge which side of the component mounter the user is present on, nor to which side the mobile unit should be shifted and so on. In other words, a component mounter that allows the user to efficiently perform the maintenance task can be provided.

It should be noted that the present invention may be embodied as a program that includes the characteristic steps described above in the component mounter control method in the present invention, a computer-readable storage medium, such as a CD-ROM, on which this program is stored and as an integrated circuit. The program may be distributed through a transfer medium such as a communication network.

The present invention can provide a component mounter control method and a component mounter which allow the user to perform the maintenance task on the component mounter efficiently.

FURTHER INFORMATION ABOUT TECHNICAL BACKGROUND TO THIS APPLICATION

The disclosure of Japanese Patent Application No. 2006-34447 filed on Feb. 10$^{th}$, 2006 including specification, drawings and claims is incorporated herein by reference in its entirety.

BRIEF DESCRIPTION OF DRAWINGS

FIG. 9 is a flowchart diagram which shows the flow of processes in position control for the mobile unit during support pin exchanging for the component mounter in the present embodiment;

FIG. 12 is a top-view outline diagram which shows an example of shifting the position of the mobile unit in the component mounter in the embodiment, which receives an instruction to provide grease to the mobile unit, (A) is a top-view outline diagram of the case in which the instruction is received from the front side of the component mounter, and (B) is a top-view outline diagram for the case in which the instruction is received from the back side of the component mounter;

FIG. 13 is a top-view outline diagram which shows an example of shifting the position of the mobile unit in the component mounter in the embodiment, which receives an instruction to clean the placement head, (A) is a top-view outline diagram of the case in which the instruction is received from the front side of the component mounter, and (B) is a top-view outline diagram for the case in which the instruction is received from the back side of the component mounter.

NUMERICAL REFERENCES

Figure 1A:
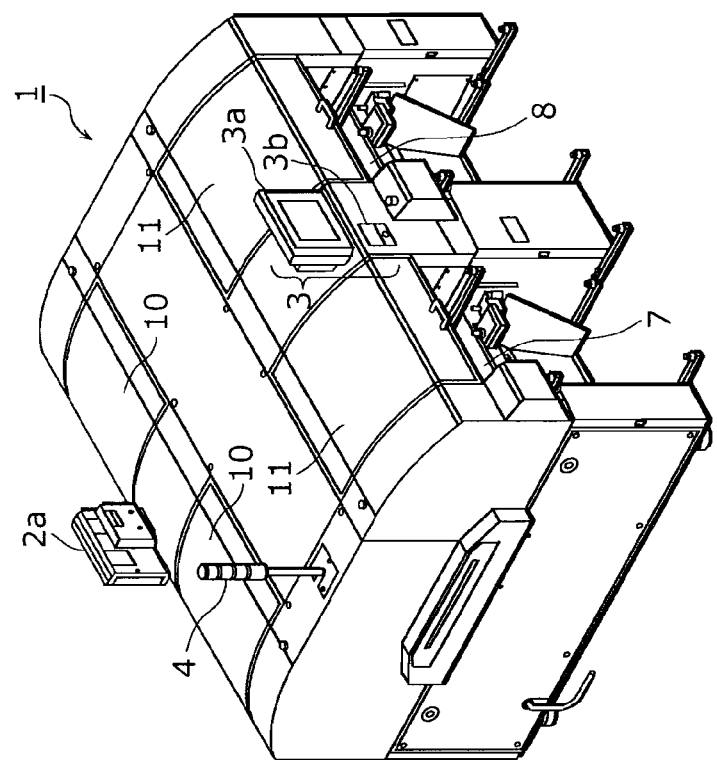
FIG. 1 is a diagram which shows an external view of the component mounter in the embodiment, (A) is a diagonal view diagram seen from the diagonally front of the component mounter, and (B) is a diagonal view diagram seen from the diagonally back of the component mounter.

1 Component mounter
2 Front side operation unit
2a Front side touch panel
2b Front side button unit
2c SELECT button
3 Back side operation unit
3a Back side touch panel
3b Back side button unit
3c SELECT button
4 Status display lamp
5, 6, 7, 8 Feeder table
9 Power switch
10 Front side cover
11 Back side cover
15 Placement head
15a Nozzle
16 XY unit
17 Beam
20 Batch exchange cart
30 Support block
31 Circuit board conveyor
31a, 31b Conveyor width approximation unit
32 Nozzle station
33 Line camera
100 Judgment unit
101 Position control unit
102 First mounting stage
103 First front side mobile unit
104 First back side mobile unit
105 Second mounting stage
106 Second front side mobile unit
107 Second back side mobile unit

DETAILED DESCRIPTION OF THE INVENTION

Below, an embodiment of the present invention is described with reference to figures.

First, the configuration of a component mounter 1 in the present embodiment is explained using FIG. 1 through FIG. 5.

Figure 1B:
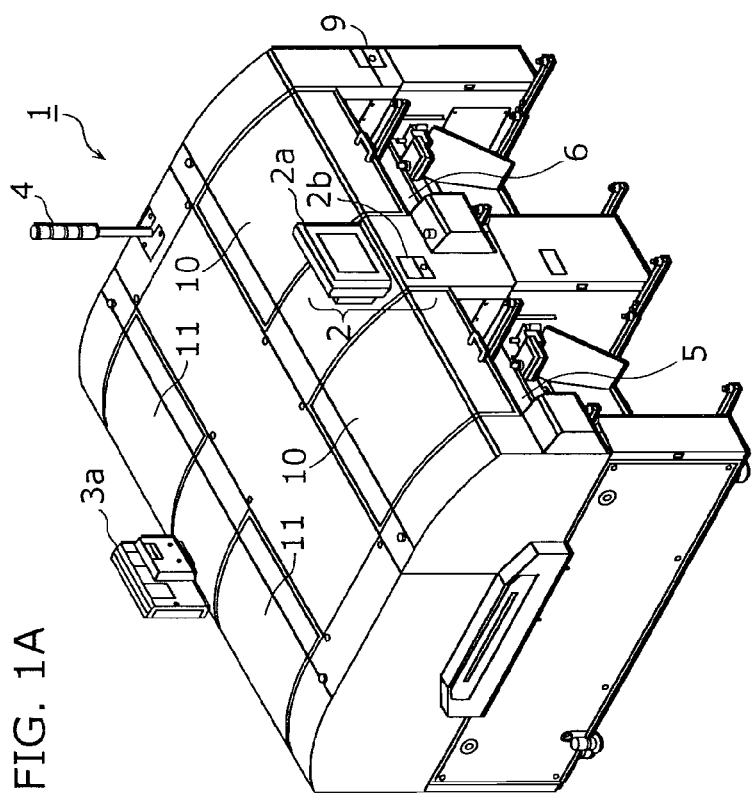

FIG. 1 is a figure which shows an external view of the component mounter 1 in the embodiment.

FIG. 1 (A) is a diagonal view diagram seen from the front side and above the component mounter 1, and 1 (B) is a diagonal view diagram seen from the back side and above the component mounter 1.

The component mounter 1 in the present embodiment is a device that mounts plural types of components onto a circuit board which is to be included in an electronic device, and includes a front side operation unit 2 and a back side operation unit 3, as shown in FIG. 1(A) and FIG. 1 (B).

The front side operation unit 2 is composed of the front side touch panel 2a and the front side button unit 2b. The front side touch panel 2a is a display device such as an LCD touch panel, which can issue an instruction to the component mounter 1 related to maintenance tasks and so on by user touch.

Note that the 'user' in the present specifications refers to the person who performs tasks for the component mounter 1, known as an 'operator' and so on.

The front side button unit 2b is a group of buttons made up of plural buttons which issue instructions to the component mounter 1 in accordance with all tasks, and so on. The back side operation unit 3 is also configured with a back side touch panel 3a and a back side button unit 3b in the same way.

Thus, the component mounter 1 is a component mounter which can accept a user instruction from the front and the back.

Note that the front side operation unit 2 and the back side operation unit 3 are exclusively controlled, such that only one can actually accept the user instruction. Display information, button configuration and so on for the operation unit is described below using FIG. 7 and FIG. 8.

Also, the component mounter 1 includes a status display lamp 4 which allows the user to visually confirm the operation status, and feeder tables 5 through 8, on which components mounted to the circuit board are temporarily placed. A power switch 9, which inputs power into and cuts off power to the main power supply of the component mounter 1, is included on the front face.

Two front side covers 10 and two back side covers 11 can each be open and shut, and maintenance tasks can be performed when necessary on each unit in the component mounter 1 with the covers set in an open state.

Figure 2:
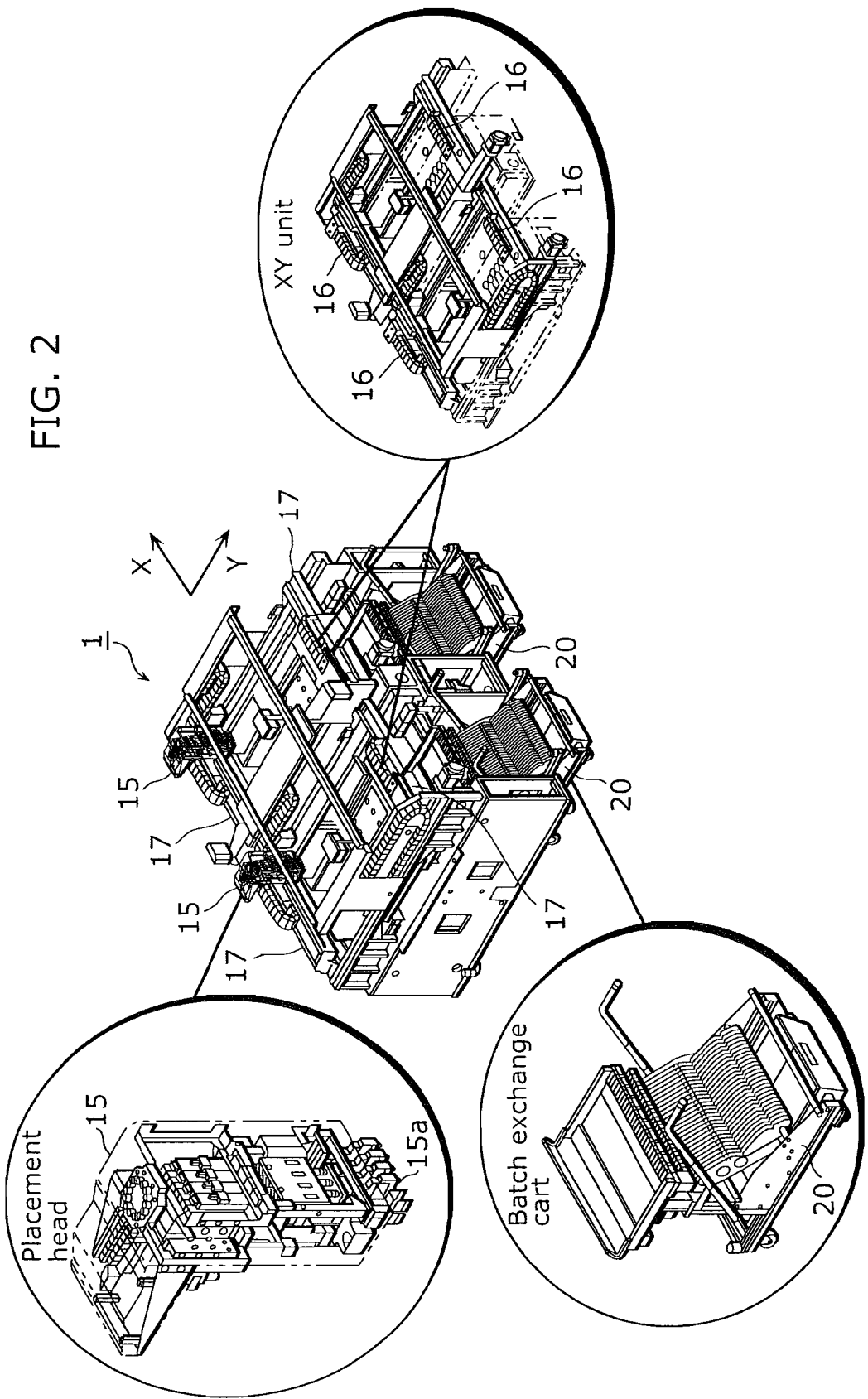
FIG. 2 is a diagram which shows the essential internal configuration of the component mounter in the embodiment.

FIG. 2 is a diagram which shows the essential internal configuration of the component mounter in the embodiment.

The component mounter 1 includes four placement heads 15, and an XY unit 16 which shifts each placement head 15 along the X-axis direction and the Y-axis direction. Note that the two conventional placement heads 15 on the front side of the component mounter are not included in the figure.

Also, as shown in the figure, the X axis direction is parallel to the conveyance direction of the circuit board, and the Y axis direction is perpendicular to the X axis direction and parallel to the board face of the circuit board.

As shown in FIG. 2, there are two XY units 16 on the front side and the back side, and an XY unit 16 is provided to each beam 17, which are parallel to the X axis direction. Accordingly, the placement heads 15 are configured on each of the beams 17 on the front side and the back side.

The placement head 15 is transferred along the beam 17 in the X axis direction by the XY unit 16. The beam 17 is transferred along the Y axis direction by the XY unit 16 while remaining parallel to the X axis direction. Thus, the placement head 15 is transferred in the X axis direction and the Y axis direction.

The placement head 15 is a structural element which repeatedly suctions and mounts components to the circuit board while shifting along the X axis direction and the Y axis direction, and includes plural nozzles 15 for suctioning and mounting components to the circuit board.

The set of placement heads 15 facing front and back can alternately mount components onto one circuit board. Alternately mounting components onto a circuit board in this way is known as "alternate punching". In other words, the component mounter 1 is an alternate punching component mounter.

The two sets of placement heads 15 facing front and back inside the component mounter 1. In other words, the component mounter 1 has two mounting stages.

The components which each placement head 15 mounts to the circuit board are supplied for example by a tape feeder. The tape feeder holds a component tape wound into a reel, and is an example of a component provision unit which provides components. Plural tape feeders can be positioned in a batch in the component mounter 1 using the batch exchange cart 20. In other words, the batch exchange cart 20 is an apparatus that can exchange the component provision units in a batch, and is an example of a component provision unit for providing components to the component mounter 1.

For example, when the type of circuit board targeted by the component mounter is changed, the component set to be mounted onto the circuit board can be changed together with the batch exchange cart 20 exchanging components.

One batch exchange cart 20 can be set for each mounting stage on the front and the back, and one batch exchange cart 20 can be set for each mounting stage on the back side of the component mounter 1, although this is not pictured.

Figure 3:
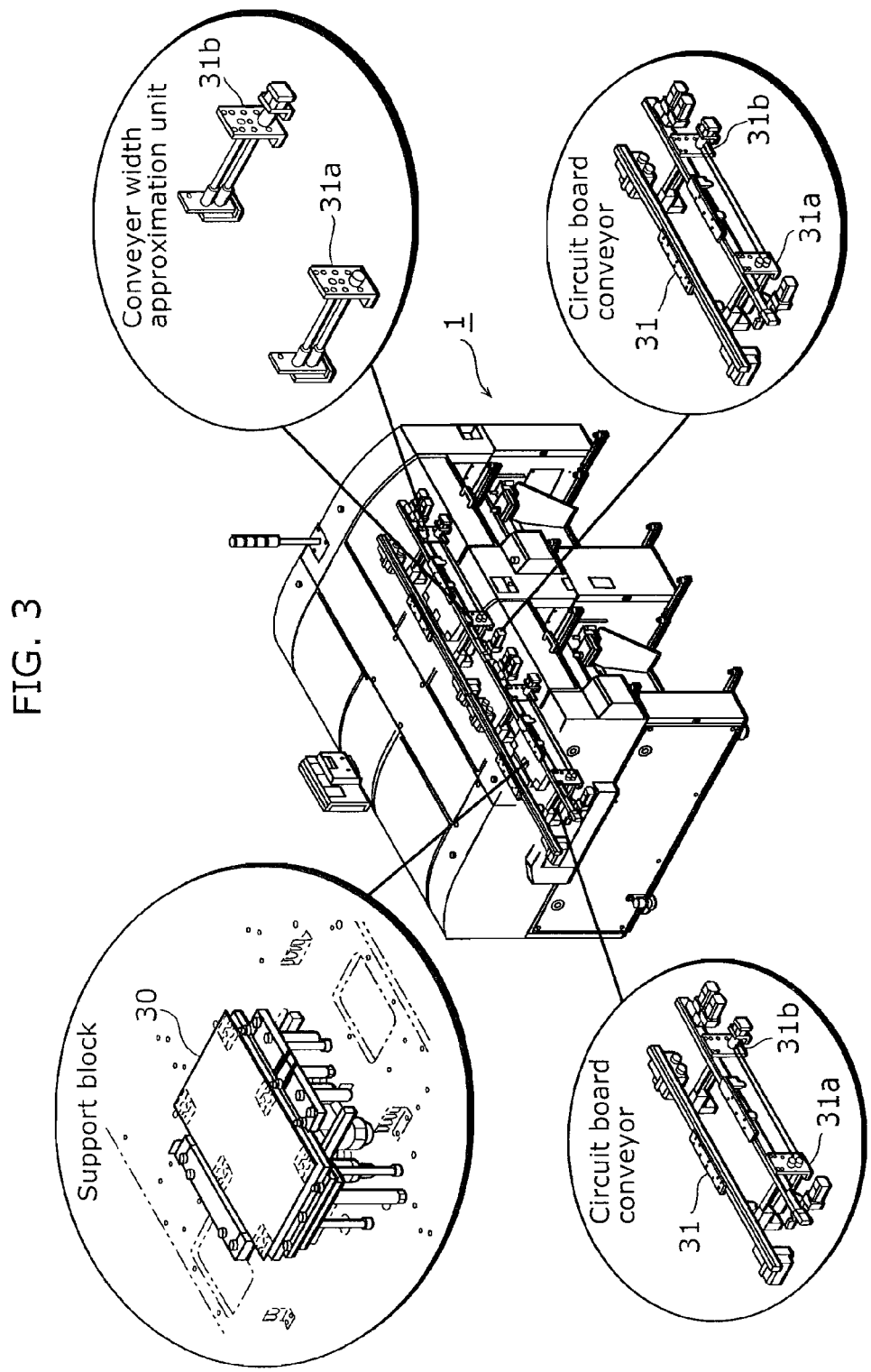
FIG. 3 is a second diagram which shows the essential internal configuration of the component mounter in the embodiment.

FIG. 3 is a second FIGURE which indicates the principal internal elements of the component mounter 1 in the embodiment.

The component mounter 1 includes a circuit board conveyor 31 for conveying the circuit board in each mounting stage. A support block 30 is included under each circuit board conveyer 31. In each circuit board conveyer 31, two rail intervals are modified by the two conveyer width approximation units 31a and 31b. For example, when exchanging the support pins, the interval between the two rails is expanded so that the support block 30 can be elevated.

The circuit board conveyed by the circuit board conveyor 31 is supported by plural support pins (not shown) held by the support block 30 and the components are mounted by a set of placement heads 15.

In the present embodiment, the circuit board is conveyed from left to right seen from the front side of the component mounter 1. In other words, components are mounted on one circuit board at the left side mounting stage using alternate punching, and further, components are mounted on one circuit board at the right side mounting stage using alternate punching.

Figure 4:
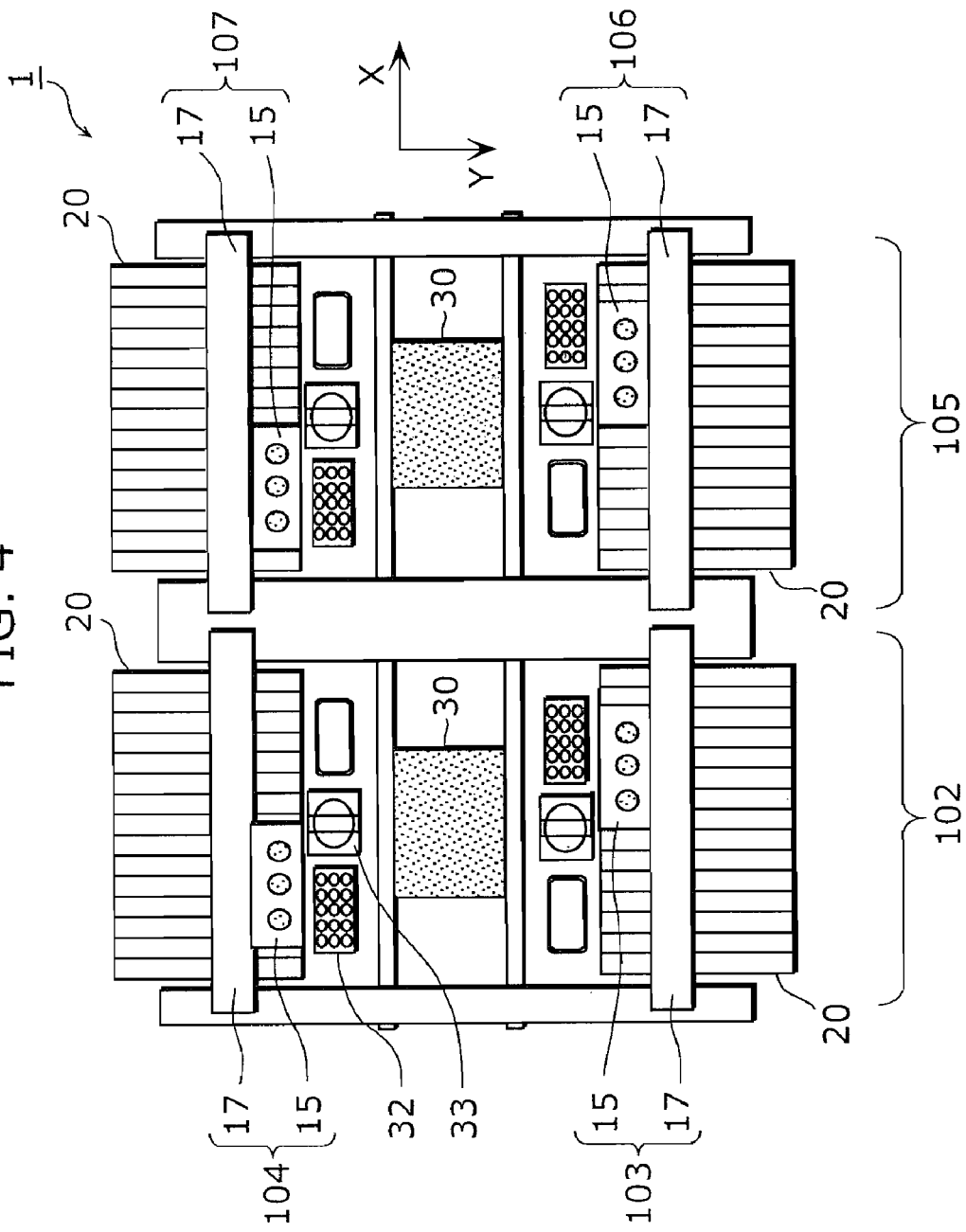
FIG. 4 is a top view diagram which shows a structural concept for the component mounter in the embodiment.

FIG. 4 is a top view diagram which shows a structural concept for the component mounter 1 in the present embodiment. Note that the bottom side of the diagram is the front side of the component mounter 1. Note that XY units 16 are present below each placement head 15, however the XY units 16 are not pictured nor are they described in order to simplify the diagrams and the descriptions. Note that each XY unit 16 shifts along the Y axis direction along with each beam 17 below.

As shown in FIG. 4, the component mounter 1 includes a nozzle station 32 and a line camera 33 in addition to the structural elements described using FIG. 1 through FIG. 3.

The nozzle station 32 is a carriage which holds plural types of nozzles, and the placement head 15 can exchange attached nozzles for nozzles placed on the nozzle station 32. Also, the line camera 33 is a camera for confirming information related to components suctioned by the placement head 15 such as the type of component and the suctioning state, and includes an optical system such as a lens. There is a nozzle station 32 and a line camera 33 for each four placement heads 15.

Also, as shown in FIG. 4, the upstream side of the component mounter 1. i.e. the mounting stage on the left side is a first mounting stage 102 and the downstream side i.e. the mounting stage on the right side is a second mounting stage 105.

Additionally, structural elements in the component mounter 1 which can be shifted and for which position can be controlled are described as mobile units. For example, the placement head 15, the beam 17 and the XY unit 16, as well as any component realized as a combination of these are mobile units. In the present embodiment, a set of the placement head 15 and the beam 17 present on each of the front and back mounting stage are handled as a mobile unit and explained below.

Specifically, as shown in FIG. 4, explanations are given for a placement head 15 and a beam 17 combined into a first front side mobile unit 103 on the front side of the first mounting stage 102, a placement head 15 and a beam 17 combined into a first back side mobile unit 104 on the back side of the first mounting stage 102, a placement head 15 and a beam 17 combined into a second front side mobile unit 106 on the front side of the second mounting stage 105, and a back side placement head 15 in the second mounting stage 105 and a beam 17 combined into a second back side mobile unit 107 on the back side of the second mounting stage 105.

Each of the above mobile units can be shifted as a whole along the Y axis direction. Also, the placement head 15 in each mobile unit can be shifted along the X axis direction on the beam 17.

Figure 5:
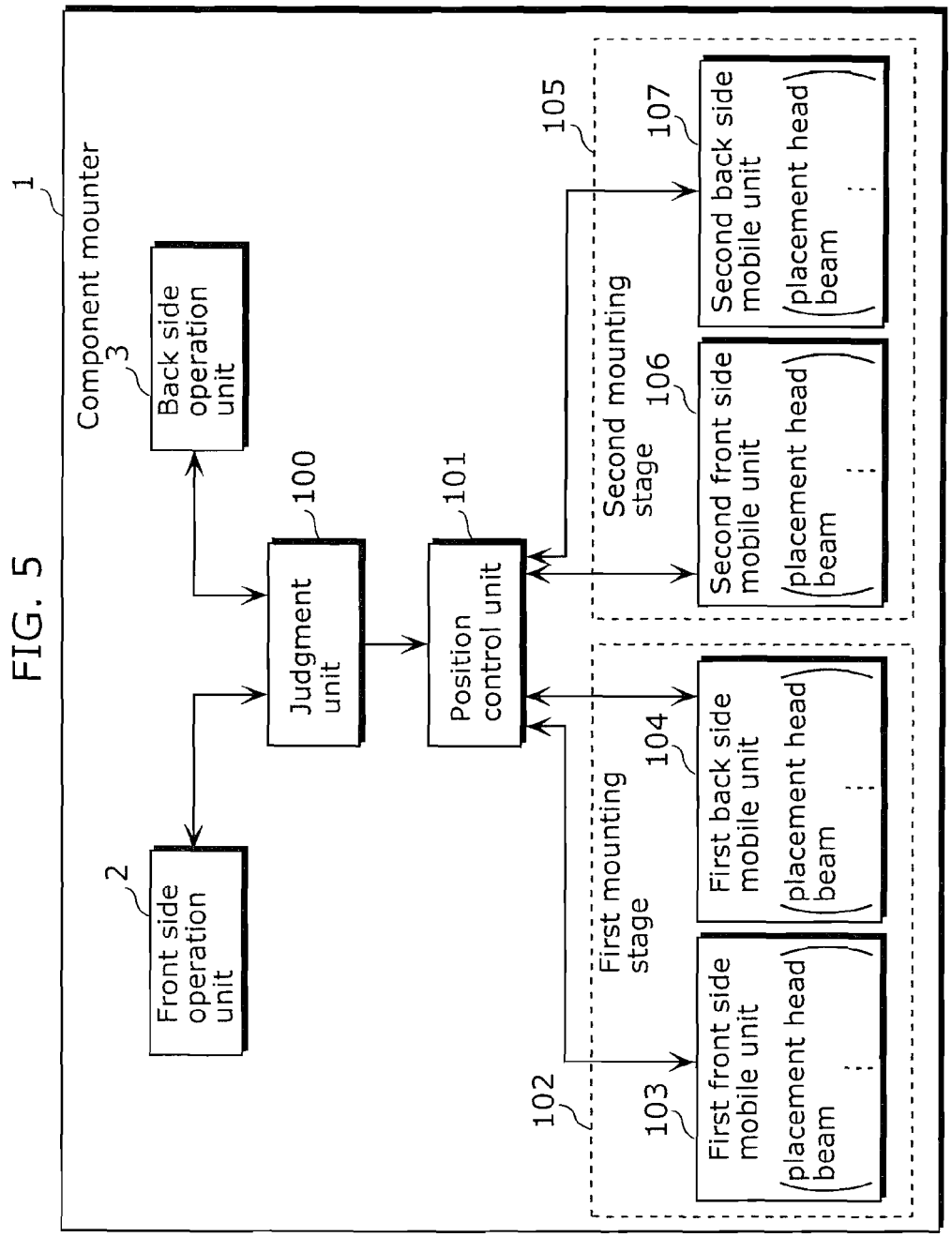
FIG. 5 is a functional block diagram which shows the functional structure of the component mounter in the embodiment.

FIG. 5 is a functional block diagram which shows the functional structure of the component mounter 1 in the present embodiment. Note that diagrams and explanations of functions, and so on, for mounting components to the circuit board that a component mounter conventionally includes are not included. Diagrams and explanations are provided concerning a control function for maintenance tasks in the component mounter 1, which is a feature of the present invention.

As shown in FIG. 5, the component mounter 1 includes in its functional structure the front side operation unit 2, the back side operation unit 3, an judgment unit 100, a position control unit 101, the first front side mobile unit 103, the First back side mobile unit 104, the second front side mobile unit 106 and the second back side mobile unit 107.

Note that, as indicated above, the first front side mobile unit 103 and the first back side mobile unit 104 respectively include a placement head 15 and a beam 17, which are mobile units for component mounting in the first mounting stage 102; the second front side mobile unit 106 and the second back side mobile unit 107 include a placement head 15 and a beam 17, which are mobile units for component mounting in the second mounting stage 105.

The front side operation unit 2 and the back side operation unit 3 are constituent units that allow the user to issue an instruction to the component mounter 1, and are placed on the front side and the back side of the component mounter 1 respectively.

The judgment unit 100 is a process unit for judging on which side of the component mounter 1 the user who issues the instruction to the component mounter 1 is present.

The position control unit 101 is a processing unit for shifting each mobile unit to a position where the maintenance task can be performed on the component mounter 1 from the side on which the user is judged to be present according to the results of the judgment by the judgment unit 100.

Thus, the position to which the mobile unit is shifted, in other words "the position at which the maintenance task can be performed on the component mounter 1 from the side on which the user is judged to be present," is a position which allows each maintenance task action, such as removing a structural element targeted by the maintenance task, visually confirming or touching the structural element to be achieved effectively. In other words, the position varies according to the type of maintenance task, the position of the structural element, its size, shape and whether the structural element is a mobile unit, or a unit other than a mobile unit, and so on, and the position is derived by these conditions and rules, which are defined by the user inside a predetermined region or outside of a predetermined area.

Next, the functions of the component mounter 1 in the present embodiment are explained using FIG. 6 through 14.

Figure 6:
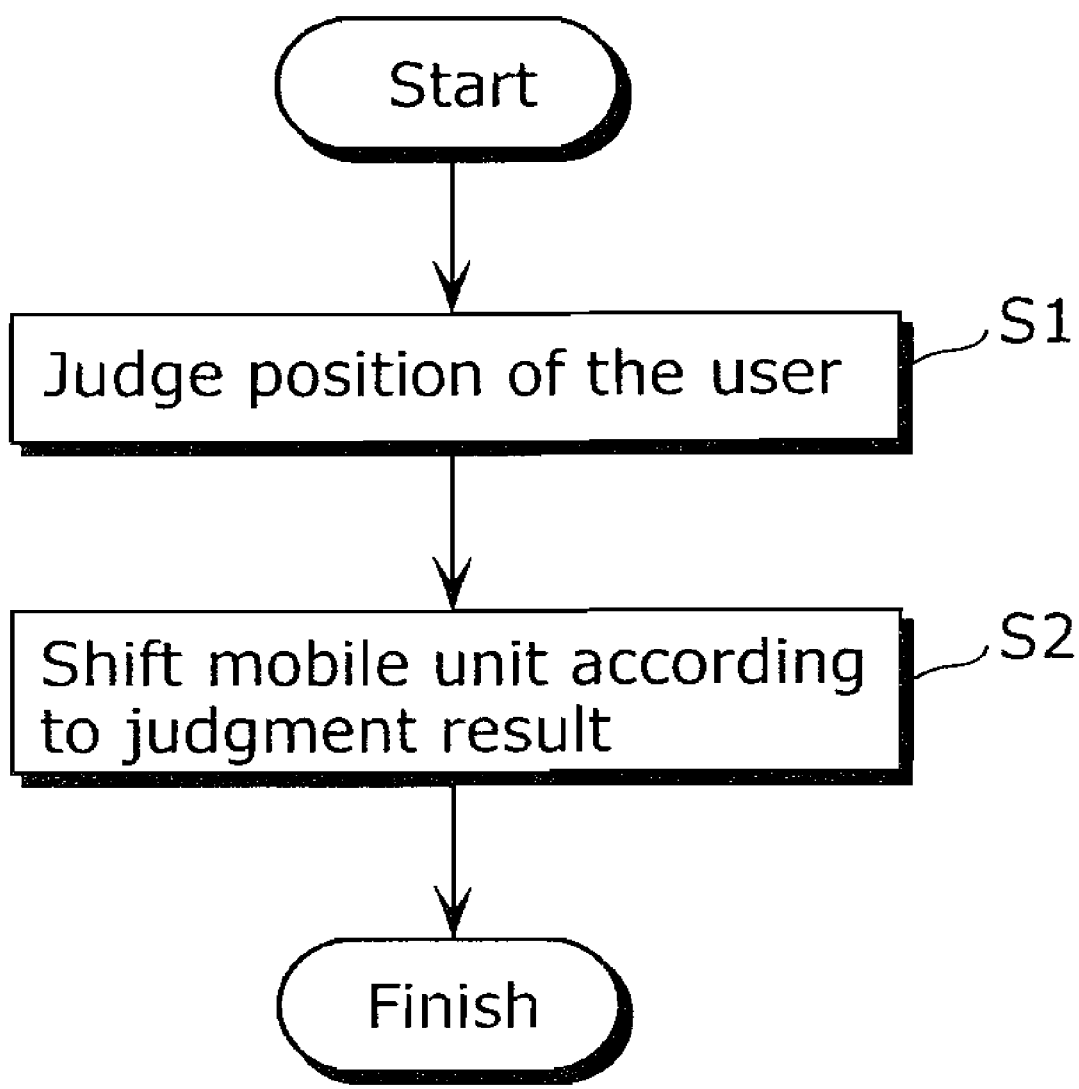
FIG. 6 is a flowchart diagram which shows an outline of operations when user-supplied instructions related to maintenance tasks are given to the component mounter in the embodiment.

FIG. 6 is a flowchart which shows an outline of functions when an instruction related to the maintenance task is issued to the component mounter 1 in the present embodiment.

As shown in the flowchart in FIG. 6, the component mounter 1 judges on which side the user is present (S1). According to the result of this judgment, the mobile unit is shifted to position at which the maintenance task can be performed on the component mounter 1 from the side on which the user is judged to be present (S2).

The above judgment (S1) is performed by the judgment unit 100 as indicated above, and the position control unit 101 shifts the first front side mobile unit 103 and so on according to the judgment result. In other words, the placement heads 15, and the like, at each mounting stage shift according to the position at which the user is present.

Thus, the user can perform maintenance task such as exchanging support pins and cleaning the line camera 33 on the side from which the instruction is issued.

Below, examples of the displays and so on are shown for each of the operation units and the operations of the component mounter 1 are explained in more detail.

Figure 7:
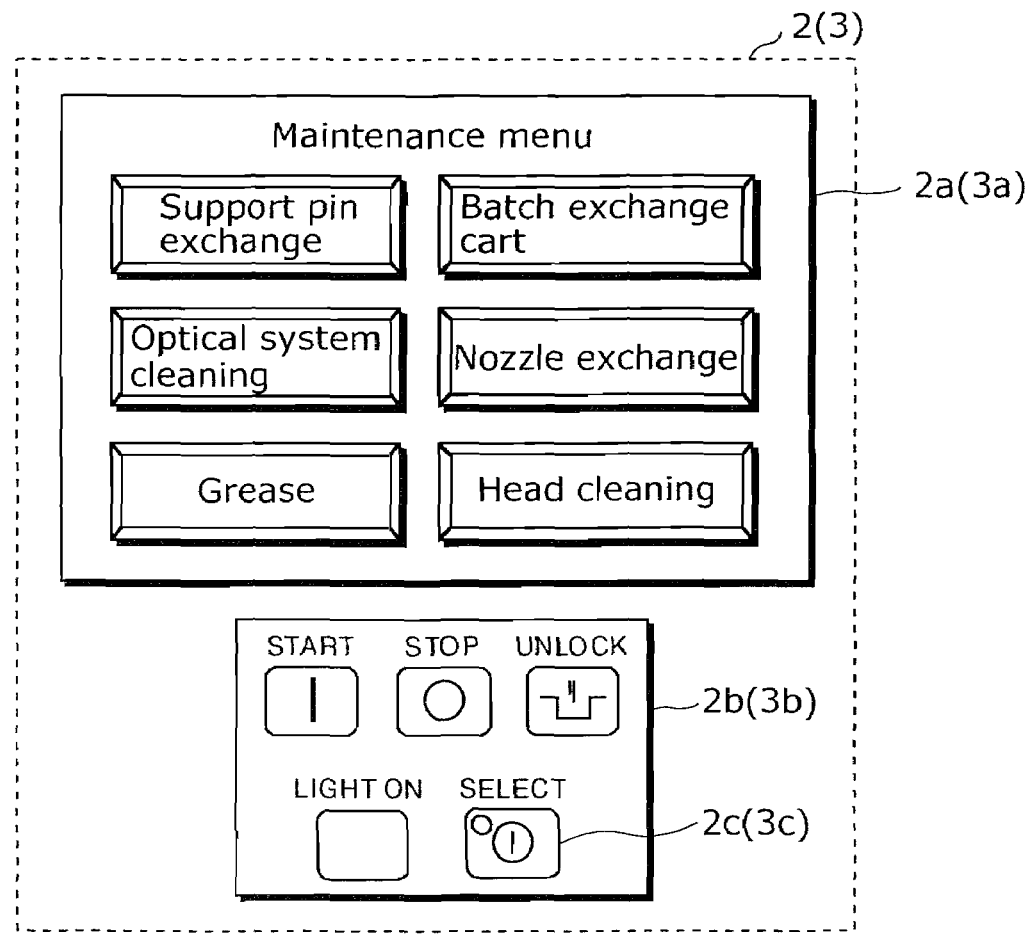
FIG. 7 is a diagram which shows a display example of the front side touch panel on the front side operation unit and an example of the button distribution for the front buttons.

FIG. 7 is a diagram which shows an example of the display for the front side touch panel 2a and an example of the button configuration for the button unit 2b in the front side operation unit 2. Note that the front side touch panel 2a shown in FIG. 7 displays a maintenance menu screen for allowing the user to issue an instruction related to the maintenance task. Also, the screen display, button configuration and their respective functions in the back side operation unit 3 are the same as the front side operation unit 2, and the code within the parentheses in FIG. 7 is code for each unit in the back side operation unit 3.

As shown in FIG. 7, there is a SELECT button 2c in the front side button unit 2b. The SELECT button 2c is a button which allows the user to issue an instruction to the component mounter 1, the instruction makes the front side operation unit 2 operational.

When this button is pressed by the user and set to ON, the front side operation unit 2 becomes operational and subsequent instructions from the user can be accepted. Note that when the SELECT button 2c is set to ON, the indicator in the upper left section of the SELECT button 2c (represented in the diagram by a circle in the upper left section of the SELECT button 2c) illuminates.

Also, when the SELECT button 2c is set to ON, the SELECT button 3c in the back side operation unit 3 is set to OFF. In the same way, when the SELECT button 3c is ON, the select button 2c in the front side operation unit 2 is set to OFF. In other words, instructions can not be given simultaneously to the component mounter 1 from both the front side operation unit 2 and the back side operation unit 3.

Also, the UNLOCK button inside the front side button unit 2b is a button for making all buttons on the front side operation unit 2 operational, besides the UNLOCK button itself, in other words, after the user has pressed the SELECT button 2c while holding down the UNLOCK button, by pressing another button while holding down the UNLOCK button, an instruction can be sent to the component mounter 1 corresponding to the other button. Note that, below, the operations for the UNLOCK button are not described for the sake of simplification.

When the user is on the front side (back side) of the component mounter 1, the user sets the SELECT button 2c (3c) to ON and presses a button according to the maintenance task desired from among the buttons displayed on the front side touch panel 2a (back side touch panel 3a). Thus, the screen transitions to a screen for the maintenance task selected.

Figure 8:
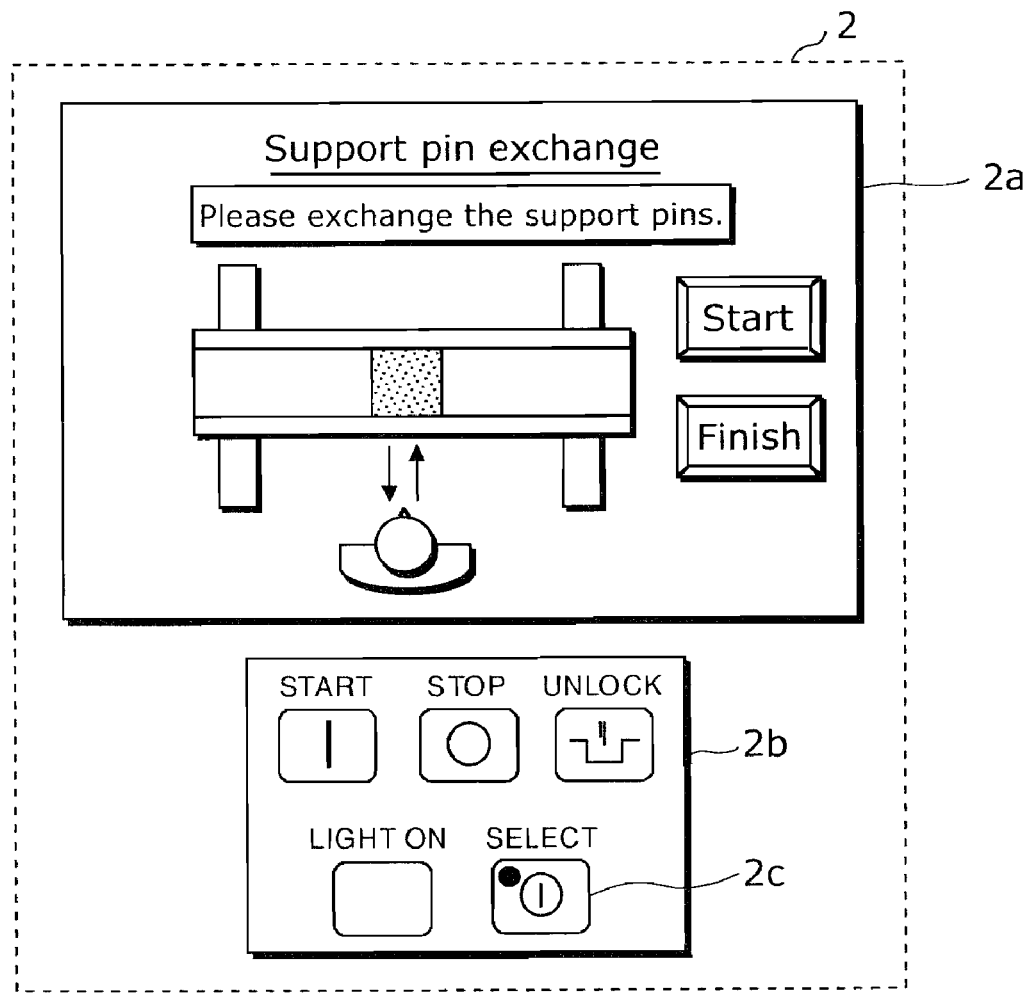
FIG. 8 is a diagram which shows a display example of the front side touch panel when support pin exchanging is performed for the component mounter in the present embodiment.

For example, when the button displaying "support pin exchange" is pressed by the user, the displayed screen transitions to the screen in FIG. 8.

FIG. 8 is a diagram which shows an example of the display in the front side touch panel 2a when the support pins are exchanged in the component mounter 1 according to the embodiment.

As shown in FIG. 8, the indicator on the select button 2c in the front side button unit 2b is illuminated (the illumination is expressed by filling the indicator in black, the same is true below), indicating that the front side operation unit 2 is operational.

Also, a guidance screen for exchanging the support pins is displayed in the front side touch panel 2a. When the button displaying 'start' is pressed by the user, in other words, when an instruction is issued by the user for exchanging the support pins, the component mounter 1 starts position control of the mobile unit for exchanging the support pins. Also, when the button displayed 'finish' is pressed by the user, position control for the mobile unit for exchanging the support pins is finished.

FIG. 9 is a flowchart which shows an operation flow for position control of the mobile unit for exchanging the support pins in the component mounter according to the embodiment.

The operations of the component mounter 1 for exchanging the support pins are explained using FIG. 9.

First, the component mounter 1 accepts that the SELECT button 2c in the front side operation unit 2 or the SELECT button 3c in the back side operation unit 3 have been set to ON by the user (S10). In other words, an instruction is accepted by the front side operation unit 2 or the back side operation unit 3 to make the operation unit utilized by the user operational.

The judgment unit 100 acquires the side of the component mounter 1 on which the user operation is performed, and judges on which side of the component mounter 1 the user is present.

More specifically, the judgment unit 100 judges whether or not the SELECT button 2c on the front side of the component mounter 1 is set to ON. Or, the judgment unit 100 judges whether the SELECT button set to ON is the SELECT button 2c or the SELECT button 3c (S11). Thus, the judgment unit 100 judges whether the user is present on the front side or on the back side of the component mounter 1.

When the user is judged to be present on the front side of the component mounter 1 (front side in S11), and an instruction has been issued by the user for support pin exchanging, the position control unit 101 shifts the first back side mobile unit 104 and the second back side mobile unit 107 to the back side (S12). Further, the position control unit 101 shifts the first front side mobile unit 103 and the second front side mobile unit 106 to the back side (S13). In other words, the component mounter 1 shifts each mobile unit outside of a predetermined area so that the maintenance task can be performed.

With these operations, the support block 30 can be removed from the side on which the user is judged to be present, i.e. the front side.

Note that the judgment unit 100 records information needed for the above judgment (S11). For example, the type of signal transmitted from the operation unit which accepts the instruction from the user, or information which indicates the signal transmission route, and information which indicates whether the operation unit which corresponds to the information is the operation unit on the front side or on the back side is coordinated and stored in a predetermined storage region (not pictured) as position information.

Using the position information, when the instruction from the user is issued from the front side operation unit 2, the judgment unit 100 can judge that the user is present on the front side, and when the instruction from the user is issued from the back side operation unit 3, the judgment unit 100 can judge that the user is present on the back side.

The position control unit 101 stores information for performing position control of the mobile unit according to the judgment result made by the judgment unit 100. For example, information which indicates on what side the user is present and information which indicates the mobile unit to be position controlled and the position to which the mobile unit should be shifted is coordinated, according to the type of maintenance task, as control information, and the control information is stored in a predetermined storage area (not pictured).

The position control unit 101 can cause the mobile unit that must be targeted for position control to shift to the destination position using the control information, according to the judgment result of the judgment unit 100. More specifically, the XY unit 16 shifts itself and causes the mobile unit targeted for position control to shift to the destination position based on information sent from the position control unit 101.

After shifting the mobile unit above, or at least before the support block 30 elevates, the rail width between each circuit board conveyor 31 at each mounting stage is expanded (S14).

When the rail width between the circuit board conveyers 31 is expanded to the point that the support block 30 can pass between the rails, each support block 30 is elevated (S15).

When each support block 30 is elevated to a position from which it can be removed, each support block is removed from the front side of the component mounter 1 by the user (S16). As a result of the judgment above by the judgment unit 100 (S11), when the user is judged to be present on the back side of the component mounter 1 (back side in S11), and when an instruction is issued by the user to exchange the pins, the position control unit 101 shifts the first front side mobile unit 103 and the second front side mobile unit 106 to the front side (S17). Further, the first back side mobile unit 104 and the second back side mobile unit 107 are shifted to the front side (S18). In other words, the component mounter 1 shifts each mobile unit outside of the predetermined area so that the maintenance task can be performed.

Performing these operations, the support block 30 can be removed from the side on which the user is judged to be present, i.e. the back side.

Subsequently, just as when the user is judged to be present on the front side of the component mounter 1 (front side in S11), the rail widths between each circuit board conveyer 31 are pulled apart (S19), and each support block 30 is elevated (S20). When each support block 30 is elevated to a position from which it can be removed, each support block is removed by the user from the back side of the component mounter 1 (S21).

When the user removes the support block 30, the user performs a pin exchange, a configuration change and so on for the support pins installed on the support block 30. Subsequently, the user sets the support block 30 in the position from which it was removed and presses a button displaying "finish" on the front side touch panel 2a.

When the button displaying "finish" is pressed by the user, the component mounter 1 shifts the support block 30 to its predetermined position, adjusts the predetermined rail width of the circuit board conveyor 31 and so on, finishing the operations related to position control for each structural element involved in the support pin exchange.

Figure 10A:
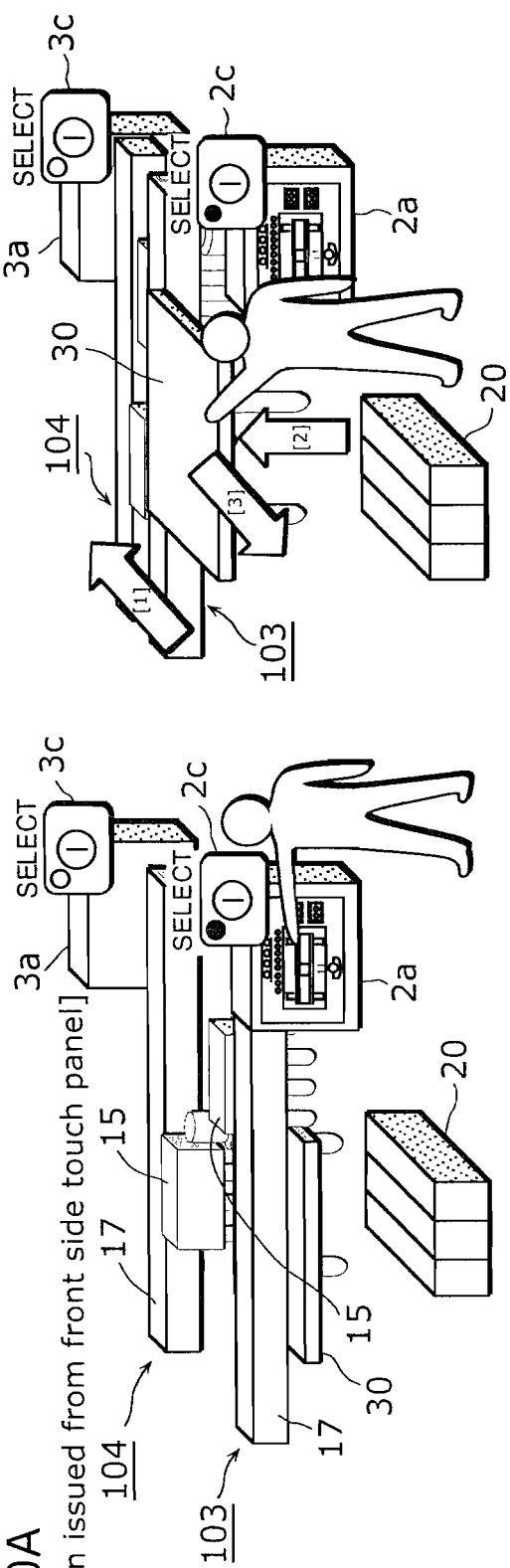
FIG. 10 is an outline diagram which shows an outline of shifting the mobile unit in the flow of processes shown in FIG. 9, and FIG. 10 (A) is an outline diagram for the case in which an instruction is received from the front side of the component mounter.
FIG. 10(B) is an outline diagram for the case in which an instruction is received from the back side of the component mounter.
Figure 10B:
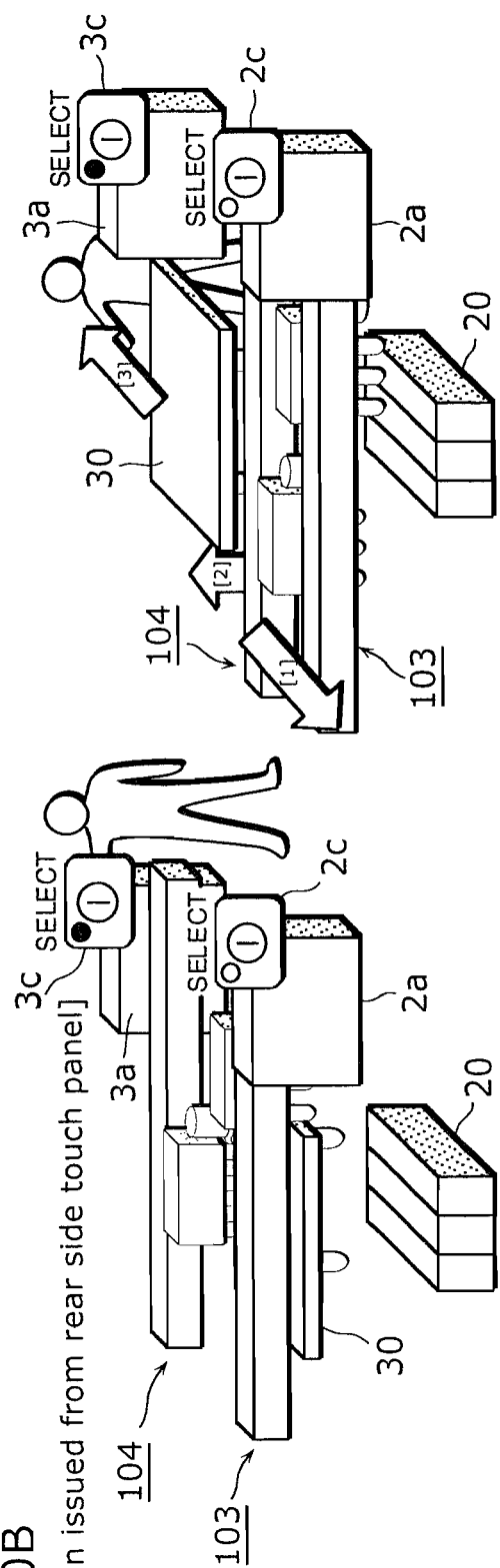

FIG. 10 is an outline diagram which shows an outline of the shifting of the mobile unit in the flow of processes shown in FIG. 9.

FIG. 10 (A) is an outline diagram for the case in which an instruction is received from the front of the component mounter 1 and FIG. 10 (B) is an outline diagram for the case in which an instruction is received from the back side of the component mounter.

Note that although FIG. 10 (A) and FIG. 10 (B) show an outline of shifting the mobile unit for the first mounting stage 102 in the component mounter 1, shifting the mobile unit for the second mounting stage 105 is performed in the same way.

As shown in the left-hand diagram of FIG. 10 (A), when the SELECT button 2c is turned ON by the user, and an instruction for exchanging the support pins is issued from the front touch panel 2a, the mobile unit of the component mounter 1 shifts as shown in the right-hand diagram of FIG. 10 (A). In other words, [1] the first back side mobile unit 104 and the first front side mobile unit 103 are retracted to the back side.

Subsequently, [2] the support block 30 elevates and [3] the user can remove the support block 30 from the front side, where the user is present.

As shown in the left-hand diagram of FIG. 10 (B), when the SELECT button 3c is turned ON by the user, and an instruction for exchanging the support pins is issued from the back touch panel 3a, the mobile unit of the component mounter 1 shifts as shown in the right-hand diagram of FIG. 10 (B). In other words, [1] the first front side mobile unit 103 and the first back side mobile unit 104 are retracted to the front side.

Subsequently, [2] the support block 30 elevates and [3] the user can remove the support block 30 from the back side, where the user is present.

Figure 11A:
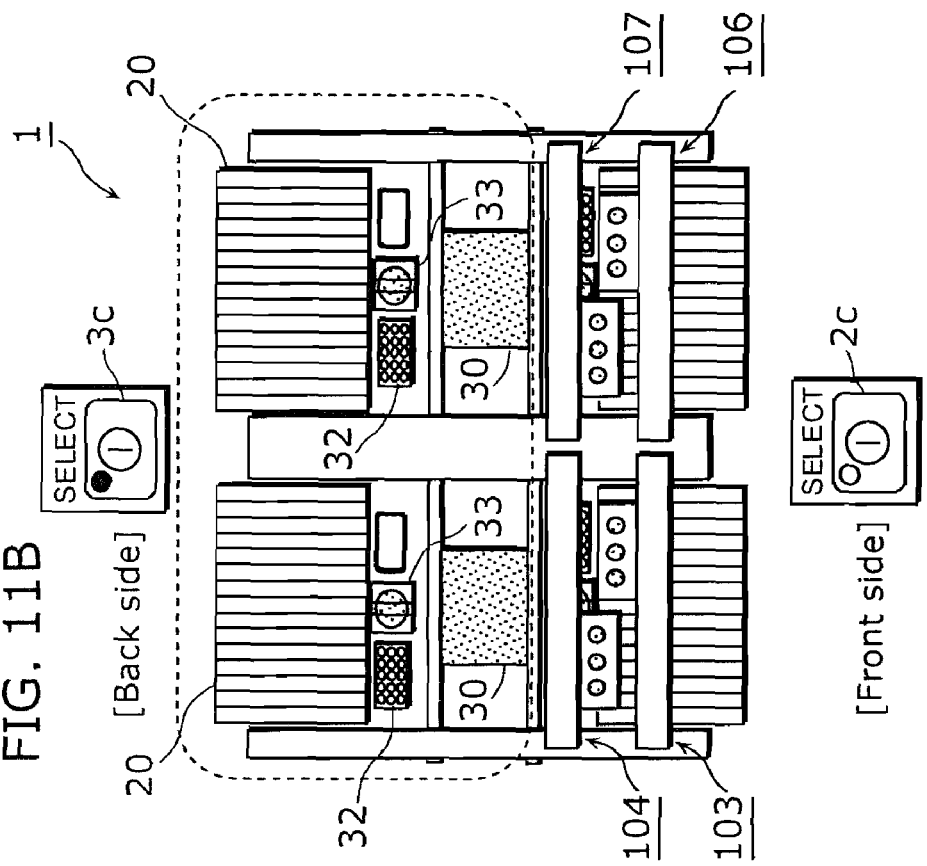
FIG. 11 is a top-view outline diagram which shows an example of shifting the position of the mobile unit in the component mounter in the embodiment, which receives an instruction to exchange support pins; (A) is a top-view outline diagram of the case in which an instruction is received from the front side of the component mounter, and (B) is a top-view outline diagram for the case in which an instruction is received from the back side of the component mounter.
Figure 11B:
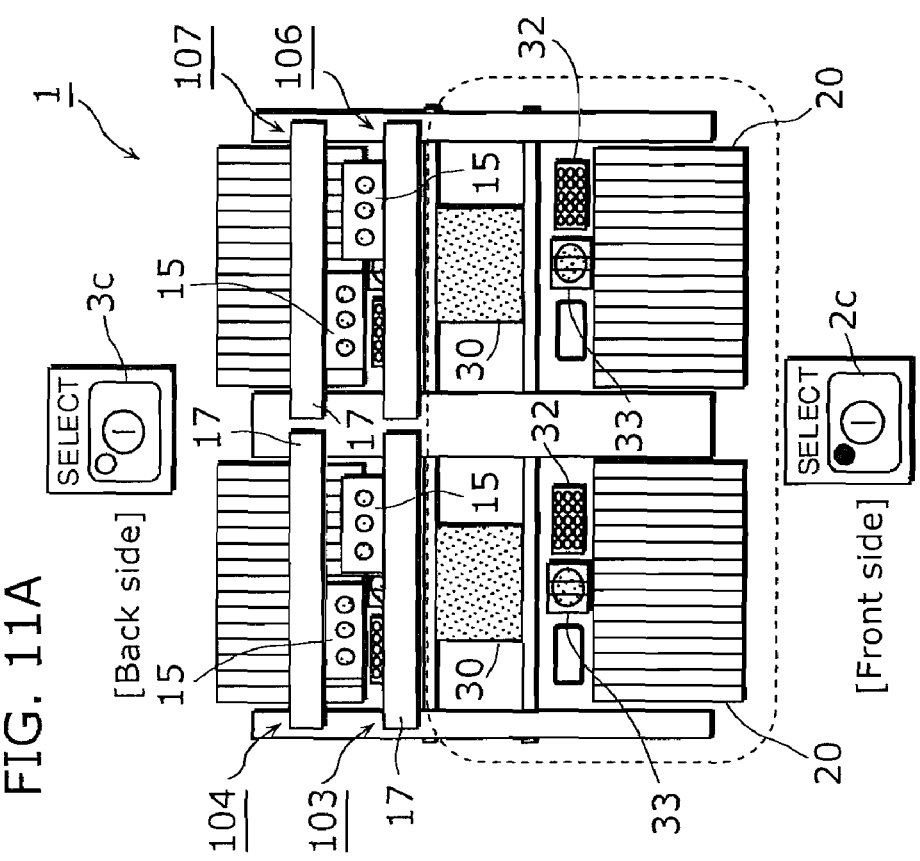

FIG. 11 is a top view outline diagram which shows an example of the shifted position of the mobile unit in the component mounter 1 which has received the instruction to exchange the support pins.

FIG. 11 (A) is a top view outline diagram for the case in which an instruction is received from the front of the component mounter 1 and FIG. 11 (B) is a top view outline diagram for the case in which an instruction is received from the back side of the component mounter 1. Note that a SELECT button is displayed on the bottom and top of both sides of the outline diagram for displaying whether an instruction has been issued by the user from the front side or the back side.

As shown in FIG. 11 (A), when the SELECT button 2c on the front side of the component mounter 1 is turned ON, in other words, when an instruction by the user has been issued from the front of the component mounter 1, the first front side mobile unit 103, the first back side mobile unit 104, the second front side mobile unit 106 and the second back side mobile unit 107, each respectively composed of the placement head 15 and the beam 17, are retracted to the back side of the component mounter 1.

Thus, each support block 30 at the two mounting stages can be removed from the front side without the placement head 15 and so on being interfered with.

Also, as shown in FIG. 11 (B), when the SELECT button 3c on the back side of the component mounter 1 is switched ON, i.e. when an instruction has been issued by the user from the back side of the component mounter 1, the mobile units such as the first front side mobile unit 103 are retracted to the front side of the component mounter 1.

Thus, each support block 30 at the two mounting stages can be removed from the back side without the placement head 15 and so on being interfered with.

Note that as shown in FIG. 11 (A) and FIG. 11 (B), when shifting two placement heads 15 to the same side, control can be performed so that parts of the two placement heads 15 overlap in the X direction and the positions of the placement heads 15 are shifted along the X axis direction. In other words, by pulling the front and back beams 17 towards each other, the space in which to perform the maintenance task can be expanded.

In this way, with the component mounter 1 in the embodiment of the present invention, the user can remove the support block 30 from the side on which the user issues the instruction. In other words, even when the instruction is issued from the back side, there is no need to move to the front side to remove the support block 30, and it can be removed from the back side.

When the user issues the instruction, there is no need for the user to keep in mind whether the user is at the front side or the back side of the component mounter 1. There is also no need to explicitly instruct the mobile unit to shift to the back side or shift to the front side.

Here, in the case that an explicit instruction is required, for example, when the user must judge the user's own position as well as the position to which the mobile unit must be shifted, select and press a button from among plural buttons, such as a button on a screen or in a button group, for exchanging the support pins such as "shift the mobile unit A to the front side".

However, there is only one button on the component mounter 1 in the embodiment of the present invention for issuing an instruction to exchange the support pins. Thus, for instance, the possibility of mistaken button presses decreases and wasted time due to mistaken button presses as well as unnecessary tasks that are generated can be reduced.

In this way, the component mounter in the embodiment of the present invention is a component mounter which can execute a component mounter control method that allows the maintenance task on the component mounter 1 to be performed efficiently by the user.

Above, the processes of the component mounter 1 are explained with support pin exchanging as an example of the maintenance task type. However, the component mounter 1 in the present embodiment can achieve the above effects even when the maintenance task is performed on other structural components of the component mounter 1.

For example, as shown in the outline diagram FIG. 11 (A), when the instruction from the user is issued from the front side of the component mounter 1, and when each mobile unit retracts to the back side, the user can perform the maintenance task from the front side of the component mounter 1 on structural components of the component mounter 1 that are within roughly the area surrounded by the dotted line in the diagram.

For example, the maintenance task can be performed from the front side of the component mounter 1, i.e. the side from which the user issued the instruction, such as exchanging component provision units such as the batch exchange cart 20, cleaning and exchanging optical systems such as the lens of the line camera 33 and exchanging a nozzle held by the nozzle station 32.

Also, as shown in the outline diagram in FIG. 11 (B), the instruction from the user is issued from the back side of the component mounter 1 and when each mobile unit retracts to the front side, the user can perform maintenance task from the back side of the component mounter 1 on roughly the area surrounded by the dotted line in the diagram.

Thus, the maintenance task can be performed from the back side of the component mounter 1, i.e. the side from which the user issued the instruction, such as cleaning and exchanging optical systems such as the lens of the line camera 33 on the backside.

When performing these maintenance tasks, the component mounter 1 does not need to force the user to judge the user's and the mobile unit's position relative to the component mounter 1. The user can perform the maintenance task from the side on which the user is present, without the user having to judge the user's and the mobile unit's position relative to the component mounter 1.

Note that the position to which the mobile unit shifts must be the same for each type of maintenance task above, in other words, when exchanging the support pins, exchanging the component provision unit, performing the maintenance task on the optical system and exchanging the nozzle held by the nozzle station 32.

In other words, when performing a maintenance task, the mobile unit should be shifted to a position which allows the maintenance task to be performed from the side on which the user is judged to be present.

For example, when cleaning the optical system such as the lens in the line camera 33 on the front side, a predetermined two-dimensional or three-dimensional area necessary for cleaning the optical system from the front side can be specified according to the position of the optical system in the component mounter 1 using conditions such as: the user can visually confirm and touch the optical system from the front side. When a mobile unit is present in the predetermined area, the optical system cannot be effectively cleaned since the mobile unit is in the way. Thus, by retracting the mobile unit, such as the placement head 15, from the predetermined area, the user can clean the optical system from the front side.

The same is true for when the maintenance task is performed on other structural elements, or when the maintenance task is performed from the back side. Also, the predetermined area for each type of maintenance task above can be determined by the position and shape of structural elements on which the maintenance task will be performed as above, or by the user's rule of thumb and so on.

Also, each type of maintenance task above can be performed by retracting the mobile unit, such as the placement head 15, from the side on which the user is present. In other words, a maintenance task performed on structural elements in the mobile unit other than the component mounter 1. However, in the component mounter, maintenance tasks which shift a mobile unit to the side on which a user is present must also be performed, for example a maintenance task of providing grease to the beam 17, which is a mobile unit.

The component mounter 1 in the present embodiment can achieve the above effects for these types of maintenance tasks on the mobile units. In other words, the maintenance tasks can be performed efficiently by a user.

FIG. 12 is a top view outline diagram which shows an example of the shifted position of the mobile unit in the component mounter 1, which has received the instruction to grease the mobile unit.

Greasing the mobile unit means providing grease that acts as a lubricant, allowing the beam 17 to shift smoothly on the Y axis direction.

FIG. 12 (A) is a top view outline diagram for the case in which an instruction is received from the front of the component mounter 1 and FIG. 12 (B) is a top view outline diagram for the case in which an instruction is received from the back side of the component mounter 1.

As shown in FIG. 12 (A), when the user turns ON the SELECT button 2c on the front side of the component mounter 1, and when the instruction to grease is issued from the front side of the component mounter 1, each beam 17 at each mounting stage is shifted into the predetermined area on the front side.

Thus, the user can grease the beam 17 at each of the two mounting stages on the front side, using a grease gun and so on from the front side of the component mounter 1, the front side being the side from which the user has issued the instruction.

Also, as shown in FIG. 12 (B), when the SELECT button 3c on the back side of the component mounter 1 is turned ON, and when the instruction to grease is issued from the back side of the component mounter 1, each beam 17 at each mounting stage is shifted into the predetermined area on the back side.

Thus, the user can grease the beam 17 located at each of the two mounting stages on the front side, using a grease gun and so on from the back side of the component mounter 1, the front side being the side from which the user has issued the instruction.

Note that FIG. 12 (A) and FIG. 12 (B) show that when there is an instruction issued from the front side, only the beam 17 on the front side is shifted in order to be greased, and when there is an instruction issued from the back side, only the back side beam 17 is shifted in order to be greased.

This is because, the front side beam 17 has a position which only allows it to be greased on the front side, and the back side beam 17 has a position which allows it only to be greased from the back side.

However, for example, when the beam 17 has a position which allows it to be greased from both the front and the back, the front and back beams 17 may be shifted to the side on which the user is judged to be present. Thus, the user can grease all of the beams 17 from the front side or the back side.

Also, when mobile units such as the XY unit 16 or the placement head 15 must be greased, greasing and position control is performed in the same way as when the beam 17 is greased above.

Also, other than greasing the beam 17, there are examples of maintenance tasks performed by shifting the mobile units to the side where the user is present, such as cleaning the placement head 15.

FIG. 13 is a top view outline diagram which shows an example of the shifted position of the mobile unit in the component mounter 1 which has received the instruction to clean the placement head 15.

FIG. 13 (A) is a top view outline diagram for the case in which an instruction is received from the front side of the component mounter 1 and FIG. 13 (B) is a top view outline diagram for the case in which an instruction is received from the back side of the component mounter 1.

As shown in FIG. 13 (A), when the user turns ON the SELECT button 2c on the front side of the component mounter 1, and when the instruction to clean the placement head 15 is issued from the front side of the component mounter 1, the front and back placement head 15 on each mounting stage is shifted into the predetermined area on the front side.

Thus, the user can clean the placement heads 15 at each of the two mounting stages, from the front side of the component mounter 1, the front side being the side from which the user has issued the instruction.

Also, as shown in FIG. 13 (B), when the SELECT button 3c on the back side of the component mounter 1 is turned ON, and when the instruction to clean the placement head 15 is issued from the back side of the component mounter 1, each placement head 15 at each mounting stage is shifted into the predetermined area on the back side.

Thus, the user can clean the placement heads 15 at each of the two mounting stages, from the back side of the component mounter 1, the back side being the side from which the user has issued the instruction.

Note that FIG. 13 (A) and FIG. 13 (B) show a case where the placement head 15 on both the front side and the back side are shifted to the side on which the user is present without regard to whether the user issued the instruction from the front side or the back side.

However, the user may for example specify for cleaning only the placement head 15, which is directly in front of the user, and shift only the placement head 15 to the side on which the user is judged to be present. Thus, it is possible to eliminate nonessential processes for shifting the placement heads 15.

In this way, the component mounter 1 in the embodiment of the present invention can not only retract the mobile unit from the side on which the user is judged to be present, but also shift the mobile unit to the side on which the user is judged to be present in order to perform maintenance tasks. Thus, the user can perform maintenance tasks on the mobile unit from this side. In this case, there is no need for the user to recognize the user's own position, or issue explicit instructions and so on about the transfer direction of the mobile unit and maintenance can be performed efficiently.

Note that the position to which each mobile unit shifts may be inside a predetermined area that varies according to the maintenance tasks that perform position control in order to shift the mobile unit to the side on which the user is judged to be present, i.e. for both greasing the beam 17 and for maintenance tasks performed on the placement head 15.

Also, when an instruction from the user to perform a maintenance task has been received from a mobile unit and it is too difficult to perform the task because the mobile unit is too close to the user, the mobile unit can be shifted further away. In other words, when performing a maintenance task, at least one part of the mobile unit should be shifted to a position which allows the maintenance task to be performed from the side on which the user is judged to be present; the direction in which the mobile unit is shifted does not matter.

For example, a predetermined area in which the front side placement head 15 can be effectively cleaned from the front side is specified according to the shape and size of the placement head 15 as well as the range within which the placement head can be shifted, and so on. Accordingly, the user can clean one of the placement heads from the front side by shifting at least one of the placement heads 15 into this predetermined area.

The same is true for when the maintenance task is performed on other structural elements, or when the maintenance task is performed from the back side. Also, the predetermined area for each type of maintenance task above can be determined by the position and shape of structural elements on which the maintenance task will be performed as above, or by the user's rule of thumb and so on.

Also, it is of course possible to equip the component mounter 1 simultaneously with a function for retracting the mobile unit and to bring the mobile unit closer. For example, in the component mounter 1, when the maintenance task instructed by the user is performed on a structural element of the component mounter besides the mobile unit, control may be performed such that the mobile unit is shifted to a position which allows the maintenance task to be performed by shifting the mobile unit to outside of the predetermined area necessary for the maintenance task. Also, when the maintenance task involves the mobile unit, control may be performed such that the mobile unit is shifted to a position which allows the maintenance task to be performed by shifting at least one part of the mobile unit into the predetermined area necessary for the maintenance task.

When this control is performed, for example, the position control unit 101 receives information that specifies the type of maintenance task instructed by the user through the judgment unit 100. Also, (1) information that indicates the side on which the user is judged to be present, (2) information that specifies structural elements on which maintenance tasks are performed and (3) information that indicates the mobile unit that must be position controlled in order to perform maintenance tasks, as well as the position to which the mobile unit must be shifted, are coordinated and stored as the control information as described above.

For example, a group of three information group conditions: "(1) front side, (2) placement head, (3) front side placement head: Y=700, back side placement head: Y=500" is prepared and stored as control information.

The position control unit 101 can perform position control for the mobile unit according to the judgment result issued by the judgment unit 100 as well as the maintenance task instructed by the user, by referencing the control information.

Note that the information which indicates the position to which the mobile unit must be shifted can be expressed by a condition with a range such as "600<Y<700". Also, the position may be indicated in two dimensions such as "Y=700, X=200" and as a condition describing only the X axis direction. Also, as described in the above example, when the target for the maintenance task is the placement head 15, the beam 17, which governs the Y axis direction of the placement head 15, is a structural element that must be shifted, and the position to which the beam 17 must be shifted may be specified.

Also, the component mounter 1 has two mounting stages, however it needs as few as one mounting stage. Also, the component mounter 1 alternately mounts the components onto the circuit board using the two placement heads 15 which face one of the mounting stages. In other words, the component mounter 1 is an alternate punching component mounter. However, the component mounter 1 need not be alternate punching, and may have as few as one placement head 15.

In other words, the effect of the judgment of the user's position and of shifting the mobile unit according to the judgment of the user position, which are characteristics of the present invention, will not be lost due to increase and decrease in the number of mounting stages or in the number of mobile units such as the placement head 15.

Also, the mobile unit, such as the placement head 15, is shifted along the X axis direction and the Y axis direction according to the judgment result. In other words the mobile unit is shifted two-dimensionally. However, the mobile unit may also be shifted three-dimensionally.

For example, the placement head 15 may be shifted up and down according to the judgment result by the judgment unit 100 when the placement head 15 has a structure that allows its absolute vertical position within the component mounter 1 to be modified.

For example, when an instruction has been issued to clean the placement head 15, the two placement heads at the front and the back are shifted to the side on which the user is judged to be present and the placement head 15 that is positioned furthest inside the component mounter 1 as seen from the user, is shifted upwards. Or, control is performed such that the placement head 15, positioned directly in front, as seen from the user, is shifted downwards. Thus, the cleaning task for the two placement heads 15 at the front and the back can be performed more easily.

Or, the component mounter 1 includes an operation unit at the front side and the back side and the position at which the user is present is one of the front side or the back side of the component mounter 1. In other words, the position at which the user is present is classified into two types, and the position of the mobile unit is controlled according to these two positions. However, the operation units do not have to be positioned one apiece at the front and the back, and may be classified into at least three types according to the position of the user.

For example, the operation unit may include an upstream and a downstream mounting stage at the front and back, in other words four operation units. Thus, in the component mounter 1, the judgment unit 100 can judge not only whether the user issued the instruction from the front side or the back side but also from the upstream side or the downstream side. In other words, the judgment unit 100 can classify the position at which the user is present into four types and judge the positions; the position control unit 101 can perform position control for the mobile unit according to the judgment result of the four types.

In this case, the judgment unit 100 may store the judgment result of the four types as the position information described above. Also, the position control unit 101 may store information that corresponds to the judgment result of the four types as the control information described above.

The position control unit 101 uses the judgment result judged by the judgment unit 100 and the control information, for example, when the position at which the user is present is judged to be the front and upstream side, the placement head 15 can be controlled to shift to the front and upstream side when maintenance tasks such as cleaning the placement head 15 are performed.

Also, the operation unit may be included on the upstream side or the downstream side of the component mounter 1. For example, when the cover of the upstream side of the component mounter 1 is removable, maintenance tasks can be performed on the component mounter 1 from the upstream side. In this case, by including an operation unit on the upstream side of the component mounter 1, the judgment unit 100 can judge whether or not the user is on the upstream side.

Accordingly, when the judgment unit 100 has judged that the user is on the upstream side, and when maintenance tasks such as cleaning the two placement heads 15 at the front and the back are performed, the two placement heads 15 can be controlled to shift to the upstream side.

In this way, there may be operation units at more than two different positions which accept user instructions, and the positions do not necessarily have to be one each at the front and the back.

The component mounter 1 can perform a more detailed judgment of the side on which the user is present according to the number of operation units. As a result, it is possible to perform more detailed position control for the mobile unit according to the position at which the user is present, and the user can be empowered to perform maintenance tasks more efficiently.

Also, the judgment unit 100 judges the side on which the user is present according to whether the SELECT button 2c or the SELECT button 3c is turned ON.

However, the SELECT buttons need not be used in the judgment of the side on which the user is present. In other words, other information may be used when this information is capable of determining the side on which the user is present.

For example, the user may be judged to be present on the front side or the back side by the judgment unit 100 acquiring information that indicates whether the user has touched the front side touch panel 2a or the back side touch panel 3a. Also, for example, the user may be judged to be present on the front side or the back side by the judgment unit 100 acquiring information that indicates whether the front side cover 10 or the back side cover 11 has been opened.

In other words, for the information used in the judgment by the judgment unit 100, the most appropriate information may be determined according to the ease by which the information may be obtained, safety in operation, efficiency or other factors.

Also, the position control unit 101 shifts the mobile unit according to the judgment result made by the judgment unit 100. However, when position control for the mobile unit is initiated and there is already a mobile unit in the predetermined area, or when a mobile unit is being retracted to outside of the predetermined area, the position control unit 101 may perform position control with a shift distance of "0".

For example, when an instruction for exchanging the support pins is issued from a user on the front side, and when each mobile unit is already at a position as shown in FIG. 11 (A), the position control unit 101 may perform position control with a shift distance of "0".

In this case, for example, by the position control unit 101 obtaining the position of each mobile unit for the point when position control for each of the mobile units is begun and by referencing the control information described above, and the position control unit 101 can derive that each mobile unit must be shifted by a distance of "0".

The position of each mobile unit at the point when position control is begun may be notified, for example, to the position control unit 101 by the XY unit 16. Or, the position control unit 101 can store the shift history of each mobile unit and use the stored information. Further, a position sensor which measures the position of each mobile unit may be included and the position control unit 101 may obtain a measurement value from the position sensor.

Thus, the position control unit 101 does not have to perform unnecessary shifts of the mobile unit. In other words, the efficiency of processes involved in maintenance tasks can be improved.

Also, the operations of the judgment unit 100, the position control unit 101 and so on in the component mounter 1 can be implemented by a computer that includes a central processing unit (CPU), a storage device and an interface which performs information input and output, and the like. For example, a signal which indicates the type of user instruction and so on transmitted from the front side operation unit 2 is received by the CPU through the interface. Further, information read out from the storage device is referenced and information which indicates the destination position to which the mobile unit such as the placement head 15 must be shifted, is transmitted to the XY unit 16 through the interface. The component mounter control method in the present invention as well as the processes of the component mounter in the present invention are realized by this kind of computer process.

The present invention can be used as a control method for controlling the position of a mobile unit such as a placement head in a component mounter, and is useful as a control method and the like when performing maintenance tasks.

The invention claimed is:

1. A method of controlling a component mounter which includes a mobile unit for mounting a component onto a circuit board, the component mounter including plural operation units for a user to issue an instruction to the component mounter, one of the plural operation units being installed to a front side and one of the plural operation units being installed to a back side of the component mounter, the method comprising:

judging on which side of the component mounter the user, who issued the instruction to the component mounter, is present;

shifting the mobile unit to a position which allows a maintenance task to be performed on the component mounter from a side on which the user is judged to be present; and accepting the instruction by the user issued from one of the operation units, wherein when the instruction by the user issued from the operation unit on the front side is accepted, the user is judged to be present on the front side of the component mounter, and when the instruction by the user issued from the operation unit on the back side is accepted, the user is judged to be present on the back side of the component mounter.

2. The component mounter control method according to claim 1, wherein the maintenance task is performed on a structural element of the component mounter besides the mobile unit, and the mobile unit is shifted to a position that allows the maintenance task to be performed by shifting the mobile unit outside of a predetermined area necessary for the maintenance task.

3. The component mounter control method according to claim 2, wherein the component mounter includes support pins and a support block which holds the support pins, which support a circuit board to which components are mounted, and the maintenance task is a task of changing a configuration of, or exchanging, the support pins held by the support block.

4. The component mounter control method according to claim 1, wherein the maintenance task is performed on the mobile unit, and the mobile unit is shifted to a position which allows the maintenance task to be performed by shifting at least one part of the mobile unit into a predetermined area from which the maintenance task can be performed.

5. The component mounter control method according to claim 1, wherein when the maintenance task is performed on a structural element of the component mounter besides the mobile unit, the mobile unit is shifted to a position which allows the maintenance task to be performed by shifting the mobile unit outside of a predetermined area necessary for the maintenance task, and when the maintenance task is performed on the mobile unit, the mobile unit is shifted to a position which allows the maintenance task to be performed by shifting at least one part of the mobile unit into a predetermined area from which the maintenance task can be performed.

6. A component mounter which includes a mobile unit for mounting a component onto a circuit board, the component mounter comprising:

plural operation units for a user to issue an instruction to the component mounter, one of the plural operation units being installed to a front side and one of the plural operation units being installed to a back side of the component mounter;

a judgment unit operable to judge on which side of the component mounter a user who issues an instruction to the component mounter is present; and a position control unit operable to shift the mobile unit to a position which allows a maintenance task to be performed on the component mounter from a side on which the user is judged to be present, wherein when the instruction by the user issued from the operation unit on the front side is accepted, the user is judged to be present on the front side of the component mounter, and when the instruction by the user issued from the operation unit on the back side is accepted, the user is judged to be present on the back side of the component mounter.

7. A non-transitory computer-readable recording medium storing a program for executing a method for controlling a component mounter, which includes a mobile unit for mounting a component onto a circuit board, the component mounter including plural operation units for a user to issue an instruction to the component mounter, one of the plural operation units being installed to a front side and one of the plural units being installed a back side of the component mounter, the program product which, when loaded into a computer, allows the computer to execute steps of the component mounter control method comprising:

judging on which side of the component mounter a user, who issues an instruction to the component mounter, is present;

shifting the mobile unit to a position which allows a maintenance task to be performed on the component mounter, from a side on which the user is judged to be present; and accepting the instruction by the user issued from one of the plural operation units, wherein when the instruction by the user issued from the operation unit on the front side is accepted, the user is judged to be present on the front side of the component mounter, and when the instruction by the user issued from the plural operation unit on the back side is accepted, the user is judged to be present on the back side of the component mounter.

* * * * *